US012772453B2

(12) United States Patent
Sung et al.

(10) Patent No.: US 12,772,453 B2
(45) Date of Patent: Oct. 20, 2026

(54) LOGIC AND MEMORY DEVICE WITH COMMON VERTICAL CHANNEL

(71) Applicant: INTERNATIONAL BUSINESS MACHINES CORPORATION, Armonk, NY (US)

(72) Inventors: Min Gyu Sung, Latham, NY (US); Ruilong Xie, Niskayuna, NY (US); Julien Frougier, Albany, NY (US); Huimei Zhou, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 18/484,550

(22) Filed: Oct. 11, 2023

(65) Prior Publication Data

US 2025/0126798 A1 Apr. 17, 2025

(51) Int. Cl.
*H10B 43/40* (2023.01)
*H10B 43/27* (2023.01)

(52) U.S. Cl.
CPC ............. *H10B 43/40* (2023.02); *H10B 43/27* (2023.02)

(58) Field of Classification Search
CPC ................................ H10B 43/40; H10B 43/27
See application file for complete search history.

(56) References Cited

U.S. PATENT DOCUMENTS

| | | | | |
|---|---|---|---|---|
| 9,997,523 | B2 | 6/2018 | Nakanishi | |
| 10,134,918 | B2 | 11/2018 | Colinge | |
| 10,483,283 | B2 | 11/2019 | Li | |
| 10,651,181 | B2 | 5/2020 | Masuoka | |
| 11,139,401 | B2 | 10/2021 | Doyle | |
| 2010/0219483 | A1 * | 9/2010 | Masuoka ............. | H10D 86/201 257/369 |
| 2022/0093765 | A1 | 3/2022 | Cai | |

FOREIGN PATENT DOCUMENTS

WO 2018182725 A1 10/2018

OTHER PUBLICATIONS

Prince, "Vertical 3D memory technologies." Published in 2014 by Wiley. 371 pages. https://vdoc.pub/download/vertical-3d-memory-technologies-6fdgvj70e820.

* cited by examiner

*Primary Examiner* — Elias Ullah
(74) *Attorney, Agent, or Firm* — Seed Intellectual Property Law Group LLP

(57) ABSTRACT

The present disclosure describes an illustrative semiconductor IC device that includes a integrated logic microdevice and a memory microdevice that share the same vertical channel. By utilizing the same vertical channel, the overall footprint area of the integrated logic microdevice and the memory microdevice is relatively reduced and allows for further scaling of the associated semiconductor IC device.

18 Claims, 16 Drawing Sheets

100

100

100

100

100

100

LOGIC AND MEMORY DEVICE WITH COMMON VERTICAL CHANNEL

BACKGROUND

The present disclosure relates to fabrication methods and resulting structures for semiconductor devices. More specifically, the present disclosure relates to fabrication methods and resulting semiconductor integrated circuit (IC) devices that include a logic microdevice and memory microdevice that share a common vertical channel.

Typical semiconductor IC devices may include separate logic microdevice(s) and memory microdevice(s), which limits the further scalability thereof.

SUMMARY

In an embodiment of the present disclosure, a semiconductor integrated circuit (IC) device is presented. The semiconductor IC device includes a vertical channel, a memory microdevice, and a logic microdevice. The memory microdevice is connected to the vertical channel and includes a memory cell in direct contact with to a sidewall of the vertical channel. The logic microdevice is connected to the vertical channel and includes a logic-gate insulator in direct contact with to the sidewall of the vertical channel.

In an embodiment of the present disclosure, an integrated device is presented. The integrated device includes a vertical channel, a memory microdevice, and a logic microdevice. The memory microdevice is connected to the vertical channel and includes a memory cell around and against each of one or more sidewalls of the vertical channel. The logic microdevice is connected to the vertical channel and includes a logic-gate insulator around and against each of the one or more sidewalls of the vertical channel.

In an embodiment of the present disclosure, a method of semiconductor integrated circuit (IC) device fabrication is presented. The method includes forming a vertical channel. The method further includes forming a logic-gate insulator directly against a sidewall of the vertical channel and forming a logic-gate directly against a sidewall of the logic-gate insulator. The method further includes forming a memory cell directly against the sidewall of the vertical channel and forming a memory-gate directly against a sidewall of the memory cell.

The above summary is not intended to describe each illustrated embodiment or every implementation or example of the present disclosure.

BRIEF DESCRIPTION OF THE DRAWINGS

The drawings included in the disclosure are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
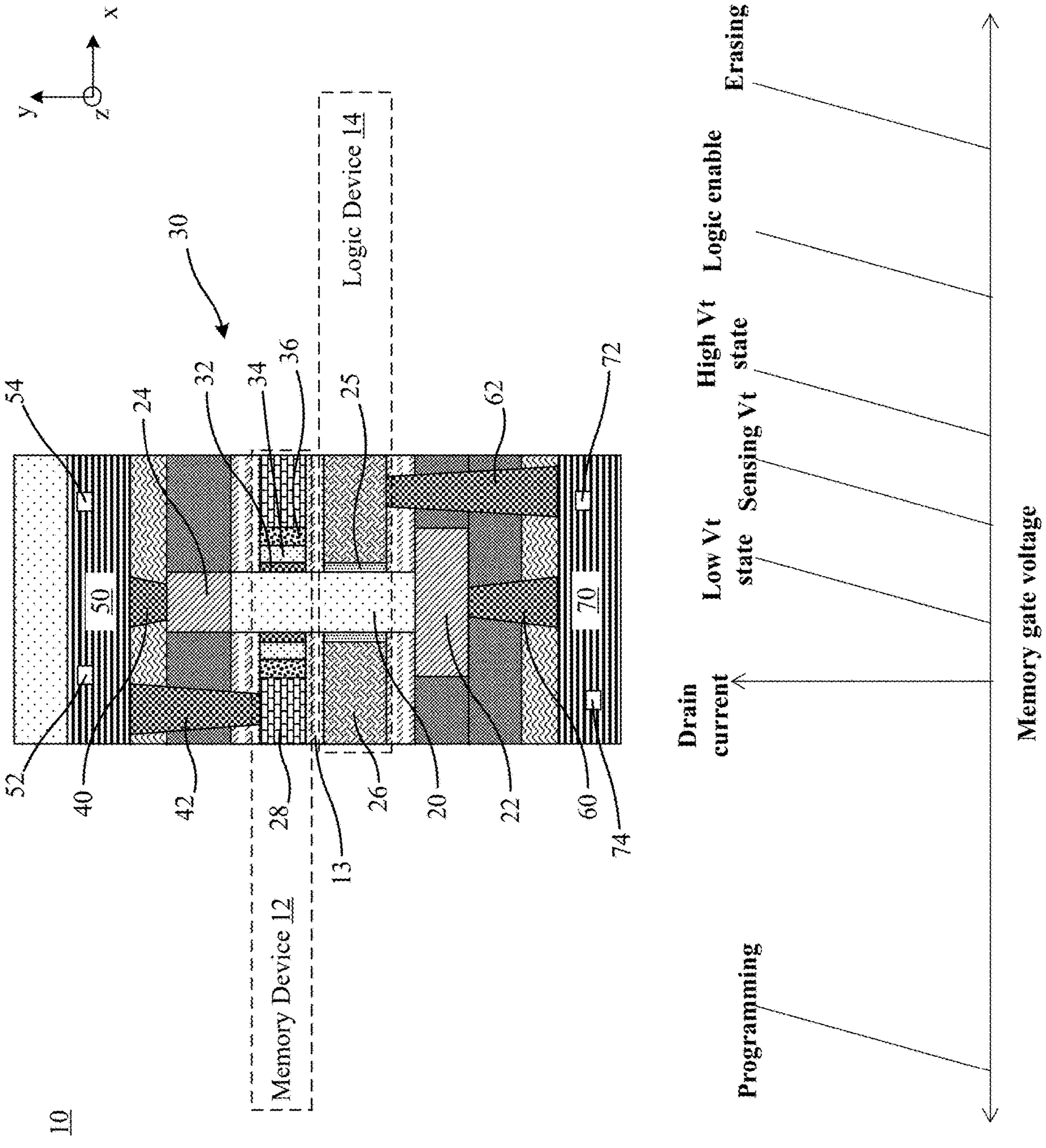
FIG. 1 depicts a cross sectional view of a semiconductor IC device that includes a logic microdevice and memory microdevice that share a common vertical channel and depicts an associated memory microdevice gate voltage operation diagram, according to one or more embodiments of the disclosure.

The embodiments of the disclosure recognize that continued scaling of semiconductor IC device is advantageous. Therefore, to further scale or otherwise provide for further scaling of semiconductor IC devices that include both memory microdevices and logic microdevices, the embodiments present a semiconductor IC device that includes a logic microdevice and a memory microdevice that share a common vertical channel. By utilizing the same vertical channel, the overall footprint area of the logic microdevice and the memory microdevice is relatively reduced and provides for further scaling of the associated semiconductor IC device.

The flowcharts and the fabrication cross sectional diagrams in the drawings illustrate a method of fabricating semiconductor IC device, such as a processor, FPGA, memory module, or the like. In some alternative implementations, the fabrication steps may occur in a different order than that which is noted in the drawings, and certain additional fabrication steps may be implemented between the steps noted in the drawings. Moreover, any of the layered structures depicted in the drawings may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the depicted structure(s) as oriented. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

As used herein, the term "coplanar" refers to two surfaces that lie in a common plane. In other words, two surfaces are coplanar if there exists a geometric plane that contains all the points of both of the surfaces.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

For the sake of brevity, conventional techniques related to semiconductor IC device fabrication may or may not be described in detail herein. Moreover, the various tasks and process steps described herein can be incorporated into a more comprehensive procedure or process having additional steps or functionality not described in detail herein. Various steps in the manufacture of semiconductor devices are well known and so, in the interest of brevity, many conventional steps will only be mentioned briefly herein or will be omitted entirely without providing the well-known process details.

In general, the various processes used to form a semiconductor IC device that may be packaged into an IC package fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, for some semiconductor IC devices, integration of logic microdevices and memory microdevices are one of the key challenges to providing increasing semiconductor IC device densities and performance increases. Further scaling may be achieved by incorporating a shared vertical channel for the logic microdevice and the memory microdevice.

In some examples, the logic microdevice and memory microdevice may utilize a frontside back end of the line (BEOL) network and a backside BEOL network. By incorporating two separate BEOL networks, there may be a logical and/or functional separation between electrical signal routing and electrical power routing through the semiconductor IC device, which may ease routing congestion in some applications, and which may further provide for semiconductor IC device scaling.

Referring now to FIG. 1, a cross sectional view of a semiconductor IC device 10 is depicted. The semiconductor IC device 10 includes a logic microdevice 14 and a memory microdevice 12 that share a common vertical channel 20. FIG. 1 also depicts an associated memory gate 28 voltage diagram for operation of the memory microdevice 12, according to one or more embodiments of the disclosure. The vertical channel 20 generally has a vertical geometry (i.e., y dimension is greater than x dimension). For clarity, the depicted xy cross section of semiconductor IC device 10 may be the same or substantially the same as the yz cross section of semiconductor IC device 10.

As depicted, semiconductor IC device 10 includes the logic microdevice 14 and the memory microdevice 12 which may be separated by a middle isolation layer 13. In an example, as depicted, the memory microdevice 12 is above the logic microdevice 14. In other words, the memory microdevice 12 may be nearest and/or connected to a frontside of the semiconductor IC device 10 (e.g., the side of the semiconductor IC device associated with frontside BEOL network 50) and the logic microdevice 14 may be nearest and/or connected to a backside of the semiconductor IC device 10 (e.g., the side of the semiconductor IC device associated with backside BEOL network 70).

The memory microdevice 12 may further include a memory gate 28 and a memory cell 30. One sidewall of the memory cell 30 may be in direct contact with to a sidewall of the vertical channel 20, and a distal sidewall of the memory cell 30 may be in direct contact with to a sidewall of the memory gate 28. The memory cell 30 may include an oxide layer 32, nitride layer 34, and oxide layer 36. The oxide layer 32, nitride layer 34, and oxide layer 36 may be referred herein as an ONO structure.

The logic microdevice 14 may further include a logic gate 26 and gate insulator 25. One sidewall of the gate insulator 25 may be in direct contact with to a sidewall of the vertical channel 20 and a distal sidewall of the gate insulator 25 may be in direct contact with to a sidewall of the logic gate 26.

The vertical channel 20 may be directly between a top source/drain region 24 and a bottom S/D region 22. For example, a top surface of the vertical channel 20 may be in direct contact with to a bottom surface of the top S/D region 24 and a bottom surface of the vertical channel 20 may be in direct contact with to a top surface of the bottom S/D region 22. In one example, as depicted, the top S/D region 24 may be self-aligned to the vertical channel 20. As a result, one or more sidewall(s) of the top S/D region 24 may be coplanar or substantially coplanar with respective one or more sidewall(s) of the vertical channel 20. In this example, parasitic capacitance between the top S/D region 24 and the memory microdevice 12 may be relatively reduced compared to other examples where the top S/D region 24 is wider than the vertical channel 20.

In one example, as depicted, the one or more sidewall(s) of the vertical channel 20 are inset with respect to respective sidewall(s) of the lower S/D region 22. In this example, fabrication complexities of forming the bottom S/D region 22 may be eased if the bottom S/D region 22 is relatively wider than the vertical channel 20.

In an example, the semiconductor IC device 10 further includes the frontside BEOL network 50 and the backside BEOL network 70. The frontside BEOL network 50 may be electrically connected to the topmost microdevice of the memory microdevice 12 or the logic microdevice 14, by one or more frontside contacts 40, 42. For example, as depicted, the memory gate 28 and a first conductive pathway 52 within the frontside BEOL network 50 may each be in direct contact with to the frontside contact 42. Similarly, the top S/D region 24 and a second conductive pathway 54 within the frontside BEOL network 50 may each be in direct contact with to the frontside contact 40. The backside BEOL network 70 may be electrically connected to the bottommost microdevice of the memory microdevice 12 or the logic microdevice 14, by one or more backside contacts 60, 62. For example, as depicted, the logic gate 26 and a first conductive pathway 72 within the backside BEOL network 70 may each be in direct contact with to the backside contact 62. Similarly, the bottom S/D region 22 and a second conductive pathway 74 within the backside BEOL network 70 may each be in direct contact with to the backside contact 60.

In an example, the frontside contact 40, the top S/D region 24, the vertical channel 20, the memory cell 30, the memory gate 28, the gate insulator 25, the logic gate 26, the bottom S/D region 22, and/or the backside contact 60 may be vertically inline (e.g., share the same or substantially a same vertical bisector or vertical axis of symmetry). The horizontal dimensions from the vertical bisector or vertical axis of symmetry of the various structures of the semiconductor IC device 10 may be minimized, to reduce the footprint of such structures, to allow for further scaling of the semiconductor IC device 10.

FIG. 1 also depicts an associated memory gate 28 voltage diagram for operation of the memory microdevice 12, according to one or more embodiments of the disclosure. For the memory gate 28 to enable logic microdevice 14 operations, a logic enable voltage may be applied to the memory gate 28. The logic enable voltage may be higher than a high Vt state of memory that turns on the vertical channel 20. Once logic microdevice 14 operations are enabled by the memory gate 28, logic microdevice 14 may operate by applying a voltage to the logic gate 26 that is greater than a logic microdevice 14 threshold voltage to turn on the logic microdevice 14 and by applying a voltage to the logic gate 26 that is less than the logic microdevice 14 threshold voltage to turn off the logic microdevice 14.

For the memory microdevice 12 to perform an erase operation to memory cell 30, the erasing voltage may be applied to memory gate 28 while the logic microdevice 14 is off. Similarly, to perform a programming operation to memory cell 30, a low programming voltage may be applied to memory gate 28 while the logic microdevice 14 is off. To sense the state of the memory cell 30, a sensing voltage that is between the lowest threshold voltage (Vt) that turns on the vertical channel 20 and the highest threshold voltage (Vt) that turns on the vertical channel 20 may be applied to the memory gate 28.

The applied read voltage causes an associated current to flow across the memory cell 30 and through the vertical channel 20, this associated read current being dependent on resistance of memory cell 30. Measurement and/or existence of the associated read current therefore provides an indication of the memory cell 30 state and the associated data value stored within the memory cell 30. For example, a relatively high or existence of the associated read current may indicate a programmed memory cell 30 state, such as a "set" state. Similarly, a relatively low or negligible existence of the read current may indicate a non-programmed memory cell 30 state, such as a "reset" state. In embodiments, the relative state of the memory cell 30 (e.g., set state or reset state) maybe indicative to the data (e.g., a low value or zero value, a high value or one value) stored within the memory cell 30.

Figure 2:
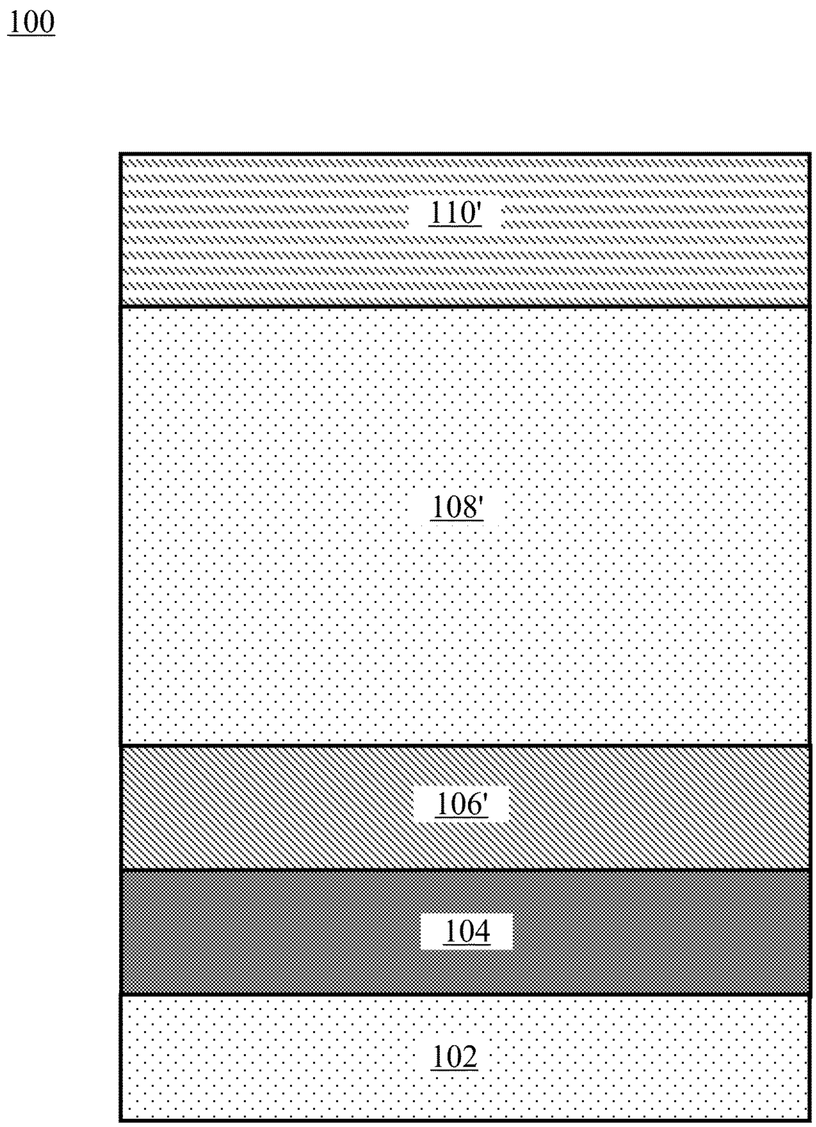
FIG. 2 though FIG. 15 depict respective cross sectional fabrication views of a semiconductor IC device that includes a logic microdevice and memory microdevice that share a common vertical channel, according to one or more embodiments of the disclosure.

FIG. 2 depicts a cross-sectional view of a semiconductor IC device 100 after initial fabrication operations, in accordance with embodiments of the present disclosure. In these initial fabrication stages, an insulator layer 104 is formed over a substrate 102, a bottom S/D layer 106' is formed over the insulator layer 104, a channel layer 108' is formed over the bottom S/D layer 106', and a capping layer 110' is formed over the channel layer 108'.

The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multilayers thereof. Although silicon (Si) is the predominantly used semiconductor material in wafer fabrication, alternative semiconductor materials can be employed, such as, but not limited to, gallium arsenide, gallium nitride, cadmium telluride, zinc selenide, and III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In another implementation, the substrate 102 includes the upper substrate, a lower substrate, and an etch stop layer between the upper substrate and the lower substrate. The etch stop layer may be a dielectric layer with etch selectivity to one or both the upper substrate and/or the lower substrate.

Subsequently, insulator layer 104 may formed over the substrate 102 by depositing a dielectric material upon the substrate 102. The insulator layer 104 may be composed of a dielectric material, including, but not limited to silicon dioxide ($SiO_2$), low-temperature oxide (LTO), high-temperature oxide (HTO), flowable oxide (FOX), or the like. The dielectric material can be deposited using deposition techniques including, but not limited to, CVD, PECVD, RFCVD, PVD, ALD, MLD, MBD, PLD, and/or LSMCD, followed by a planarization process, such as, chemical mechanical polish (CMP) to remove excess insulator layer 104 material. In a non-limiting illustrative embodiment, a height or vertical thickness of insulator layer 104 can be in the range of about 3 nm to about 100 nm.

Subsequently, bottom S/D layer 106' may be formed over the insulator layer 104. The bottom S/D layer 106' is generally a semiconductor material, such as silicon (Si) or silicon germanium (SiGe) that includes a dopant. The dopant that is present in the bottom S/D layer 106' can be either a p-type dopant or an n-type dopant. The term "p-type" refers to the addition of impurities to an intrinsic semiconductor that creates deficiencies of valence electrons.

In a silicon-containing semiconductor material, examples of p-type dopants, i.e., impurities, include, but are not limited to, boron, aluminum, gallium, phosphorus and indium. "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the bottom S/D layer 106' can have a dopant concentration of from $4\times10^{20}$ atoms/cm$^3$ to $3\times10^{21}$ atoms/cm$^3$.

According to an embodiment, the bottom S/D layer 106' is epitaxially grown. Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some epitaxial growth operations (not presently shown), epitaxial growth and/or deposition processes may be selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from, for example, 550° C. to 900° C. Although higher temperature typically results in faster deposition, the faster deposition may result in crystal defects and film cracking.

A number of different sources may be used for the epitaxial growth of Si and SiGe layers. In some embodiments, a gas source for the deposition of epitaxial semiconductor material includes a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

In some examples, the bottom S/D layer 106' are formed by in-situ doped epitaxial growth. The use of an in situ doping process is merely an example. For instance, one may instead employ an ex situ process to introduce dopants. Other doping techniques can be used to incorporate dopants. Dopant techniques include but are not limited to, ion implantation, gas phase doping, plasma doping, plasma immersion ion implantation, cluster doping, infusion doping, liquid phase doping, solid phase doping, in situ epitaxy growth, or any suitable combination of those techniques.

Alternatively, the bottom S/D layer 106' can be formed by deposition techniques, such as, for example, including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD).

In a non-limiting illustrative embodiment, a height or vertical thickness of the bottom S/D layer 106' can be in the range of about 3 nm to about 25 nm.

Subsequently, channel layer 108' may be formed upon the bottom S/D layer 106'. The channel layer 108' is composed of a semiconductor material with etch selectivity relative to the bottom S/D layer 106'. For example, bottom S/D layer 106' is composed of SiGe and the appropriate dopant and bottom S/D layer 106' is composed of Si.

According to an embodiment, the channel layer 108' is epitaxially grown. Alternatively, the channel layer 108' can be formed by deposition techniques, such as, for example, including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD).

In a non-limiting illustrative embodiment, a height or vertical thickness of the channel layer 108' can be in the range of about 25 nm to about 200 nm.

Subsequently, capping layer 110' may be formed upon the channel layer 108'. The capping layer 110' is composed of a semiconductor material with etch selectivity relative to the channel layer 108'. For example, bottom S/D layer 106' is composed of Si and capping layer 110' is composed of a silicon nitride, silicon oxide, or the like.

According to an embodiment, the channel layer 108' can be formed by deposition techniques, such as, for example, including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD).

In a non-limiting illustrative embodiment, a height or vertical thickness of the capping layer 110' can be in the range of about 10 nm to about 200 nm.

Figure 3:
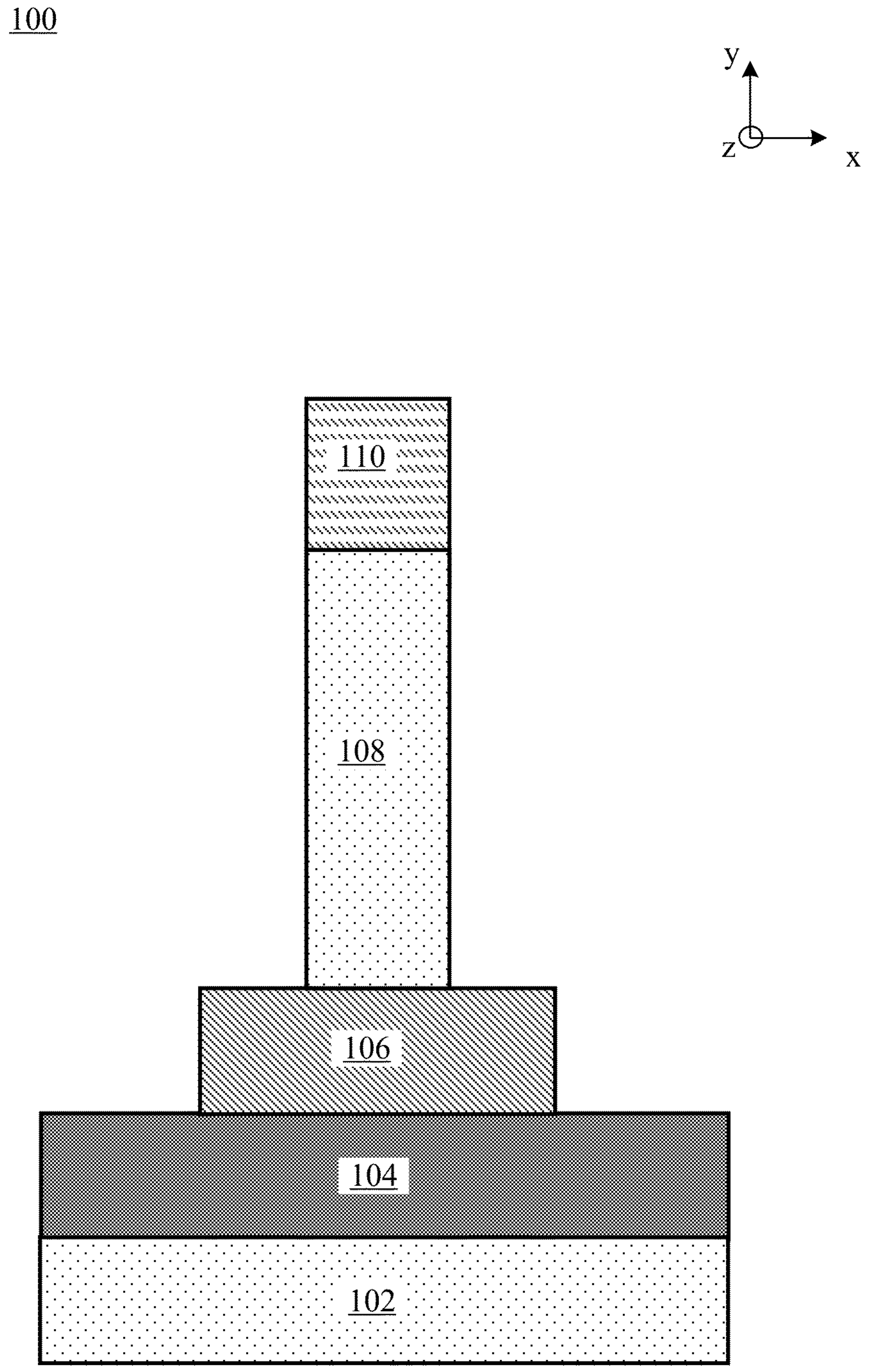

Referring now to FIG. 3 the semiconductor IC device 100 is depicted at a particular fabrication stage. At the present fabrication stage, a sacrificial cap 110, a vertical channel 108, and a bottom S/D region 106 may be formed by pattering the capping layer 110', the channel layer 108', and the bottom S/D layer 106'.

The capping layer 110', the channel layer 108', and the bottom S/D layer 106' may be patterned by the same or shared lithography and etch process(es) or separate sequential lithography and etch processes. In such process(es), one or more appropriate masks may be applied and patterned. An opening in the patterned mask(s) may expose the portions of the underlying capping layer 110', channel layer 108', and/or bottom S/D layer 106' to be removed while other protected portions of semiconductor IC device 100 under the mask(s) may be protected and retained. In such process(es), dry and/or wet etching processes can have etching parameters that can be tuned, such as etchants used, etching temperature, etching solution concentration, etching pressure, source power, RF bias voltage, RF bias power, etchant flow rate, relative material selections to provide for etch selectivity, or the like, to promote desired material removal and desired material retention.

For clarity, the retained portion of the patterned capping layer 110' may form the sacrificial cap 110, the retained portion of the channel layer 108' may form the vertical channel 108, and the retained portion of the bottom S/D layer 106' may form the bottom S/D region 106. As sacrificial cap 110, vertical channel 108, and bottom S/D region 106 are formed from their associated layers, sacrificial cap 110, vertical channel 108, and bottom S/D region 106 generally retain the material properties of their associated layers. In some embodiments, sacrificial cap 110 is composed of the dielectric material of capping layer 110', S/D region 106 is composed of the semiconductor material and dopant of the bottom S/D layer 106', and vertical channel 108 is composed of the semiconductor material of channel layer 108'.

In some implementations, respective sidewalls of the vertical channel 108 are substantially coplanar with respective sidewalls of the sacrificial cap 110. The vertical channel 108 generally has a vertical orientation (i.e., an x-axis dimension of the vertical channel 108 is smaller than a y-axis dimension of the vertical channel).

In some implementations, respective sidewalls of the vertical channel 108 are substantially coplanar with respective sidewalls of the bottom S/D region 106. In some implementations, respective sidewalls of the bottom S/D region 106 are self-aligned with respect to an associated sidewall of the vertical channel 108. Alternatively, as depicted, respective sidewall(s) of the vertical channel 108 are inset with respect to respective sidewall(s) of the bottom S/D region 106. In this example, therefore, the top surface of the bottom S/D region 106 may be utilized as an etch stop during subsequent semiconductor IC device 100 fabrication operations.

A yz planar cross-section of, and through, the sacrificial cap 110, vertical channel 108, and bottom S/D region 106 may be substantially the same as that shown in the xy planar cross-section. The sacrificial cap 110, vertical channel 108, and bottom S/D region 106 may have an xz planar top-down geometry of a circle, ellipse, square, rectangle, or the like.

In some examples, the bottom S/D region 106 may be a source region and may be doped with an n-type dopant atom (i.e., an element from Group VB of the Periodic Table of Elements, such as, for example, P, Sb, or As) or a p-type dopant atom (such as an element from Group IIIB of the Periodic Table Elements, such as, for example, In or B) or $BF_2$. Typically, n-type dopants are used in forming the source region. The implant energies used in forming the source region may be typically from about 10 to about 40 keV and ion doses from about 1E15 to about 5E15 atoms/$cm^2$ are typically used to form a heavily doped region. An annealing step may follow the ion implantation or dopant operations.

Figure 4:
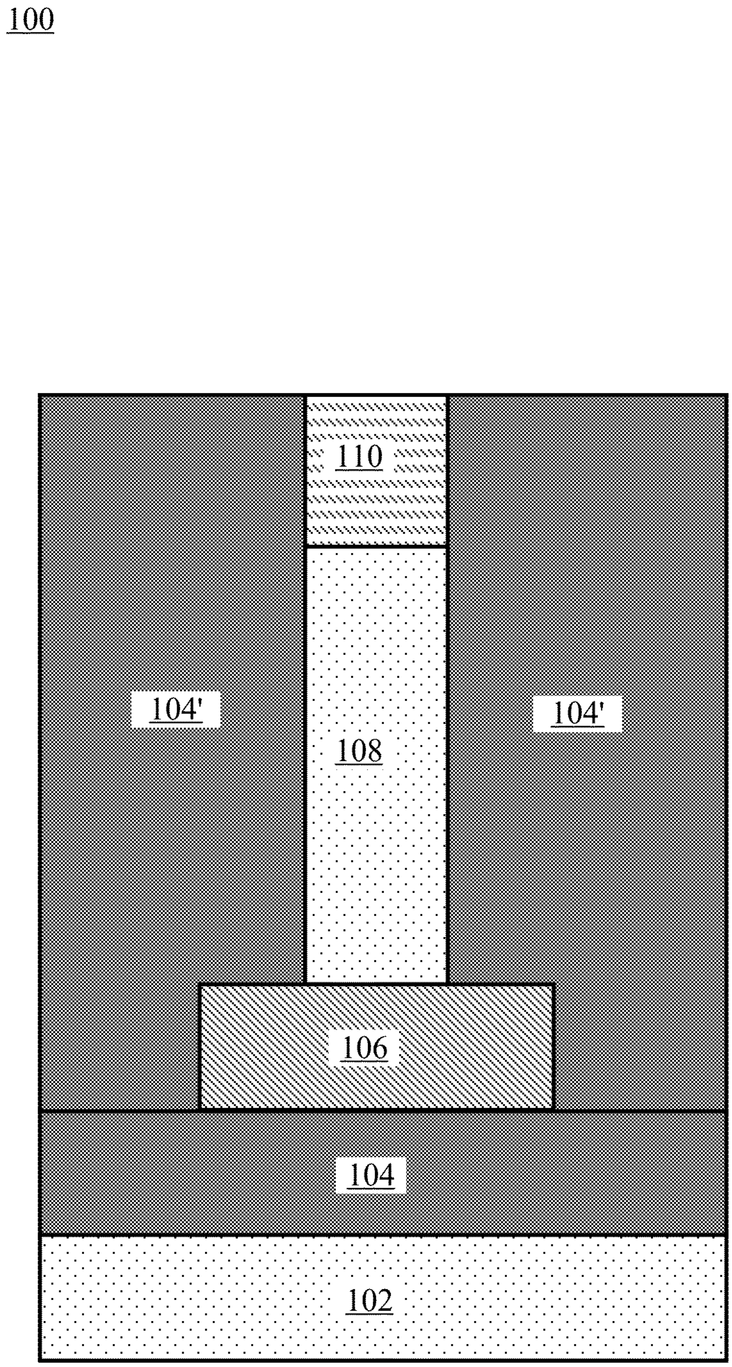

Referring now to FIG. 4, the semiconductor IC device 100 is depicted at a particular fabrication stage. At the present fabrication stage, an insulator layer 104' is formed. The insulator layer 104' may be formed over the insulator layer 104, over the bottom S/D region 106, over the vertical channel 108, and over the sacrificial cap 110 by depositing a dielectric material thereupon. The insulator layer 104' may be composed of the same material as the insulator layer 104, as depicted, but may, in alternative implementations, be composed of a relatively different dielectric material. The dielectric material can be deposited using deposition techniques including, but not limited to, CVD, PECVD, RFCVD, PVD, ALD, MLD, MBD, PLD, and/or LSMCD, followed by a planarization process, such as, chemical mechanical polish (CMP) to remove excess insulator layer 104' material. After the planarization process, a top surface of the insulator layer 104', and a top surface of the sacrificial cap 110 may be horizontal, substantially horizontal, coplanar, and/or substantially coplanar.

Figure 5:
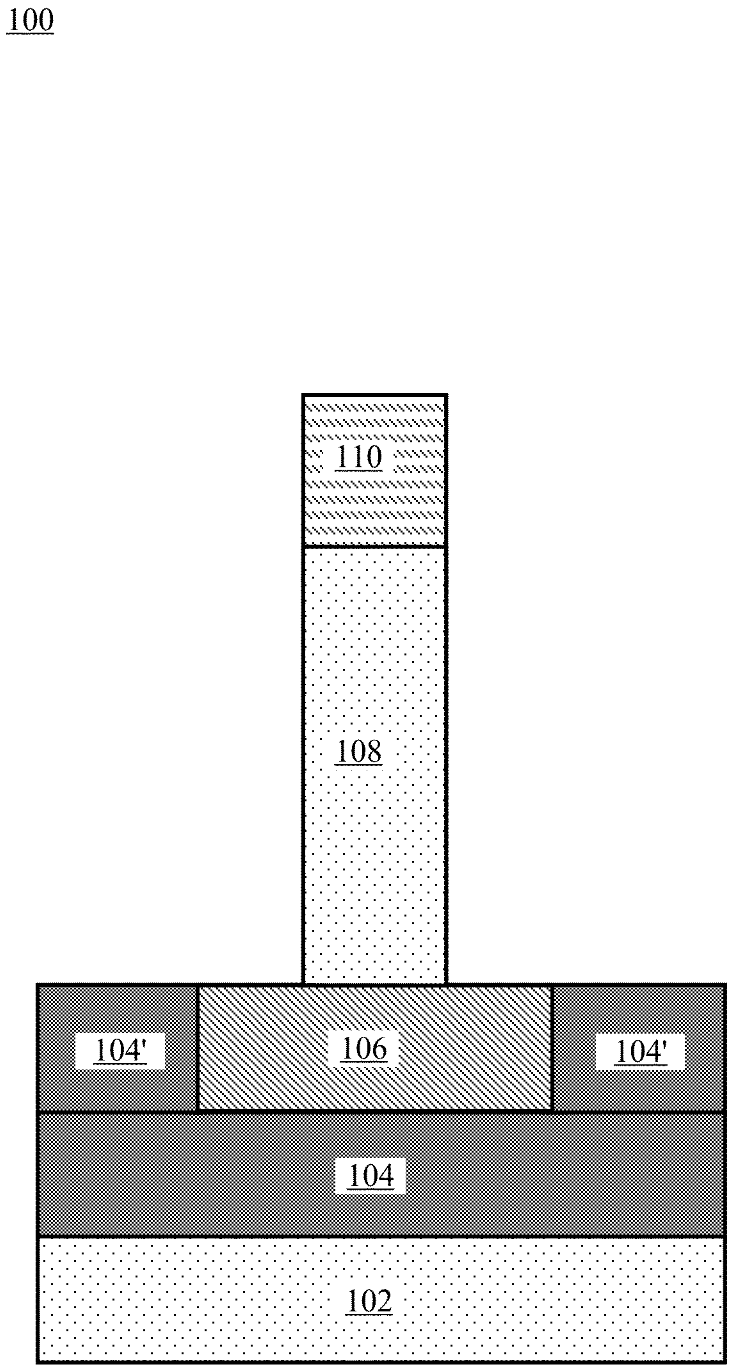

Referring now to FIG. 5, which depicts the semiconductor IC device 100, at a particular fabrication stage. At this fabrication stage, the insulator layer 104' is partially recessed.

The insulator layer 104' may be partially recessed by appropriate etch process(es). In such process(es), one or more appropriate masks may be applied and patterned. In such process(es), dry and/or wet etching processes can have etching parameters that can be tuned, such as etchants used, etching temperature, etching solution concentration, etching pressure, source power, RF bias voltage, RF bias power, etchant flow rate, relative material selections to provide for etch selectivity, or the like, to promote desired insulator layer 104' removal and desired insulator layer 104' retention. In certain implementations, the etchant utilized to remove insulator layer 104' provides for an etch that is selective to the material of sacrificial capping layer 110, vertical channel 108, and bottom S/D region 106.

In certain implementations, a top surface of the S/D region 106 may be utilized as an etch stop of the insulator 104' layer material. As a result, a top surface of the insulator layer 104' and a top surface of the bottom S/D region 106 may be horizontal, substantially horizontal, coplanar, and/or substantially coplanar. In other implementations, the etch may be timed or otherwise controlled to remove the insulator layer 104' material that is relatively above the bottom S/D region 106.

Figure 6:
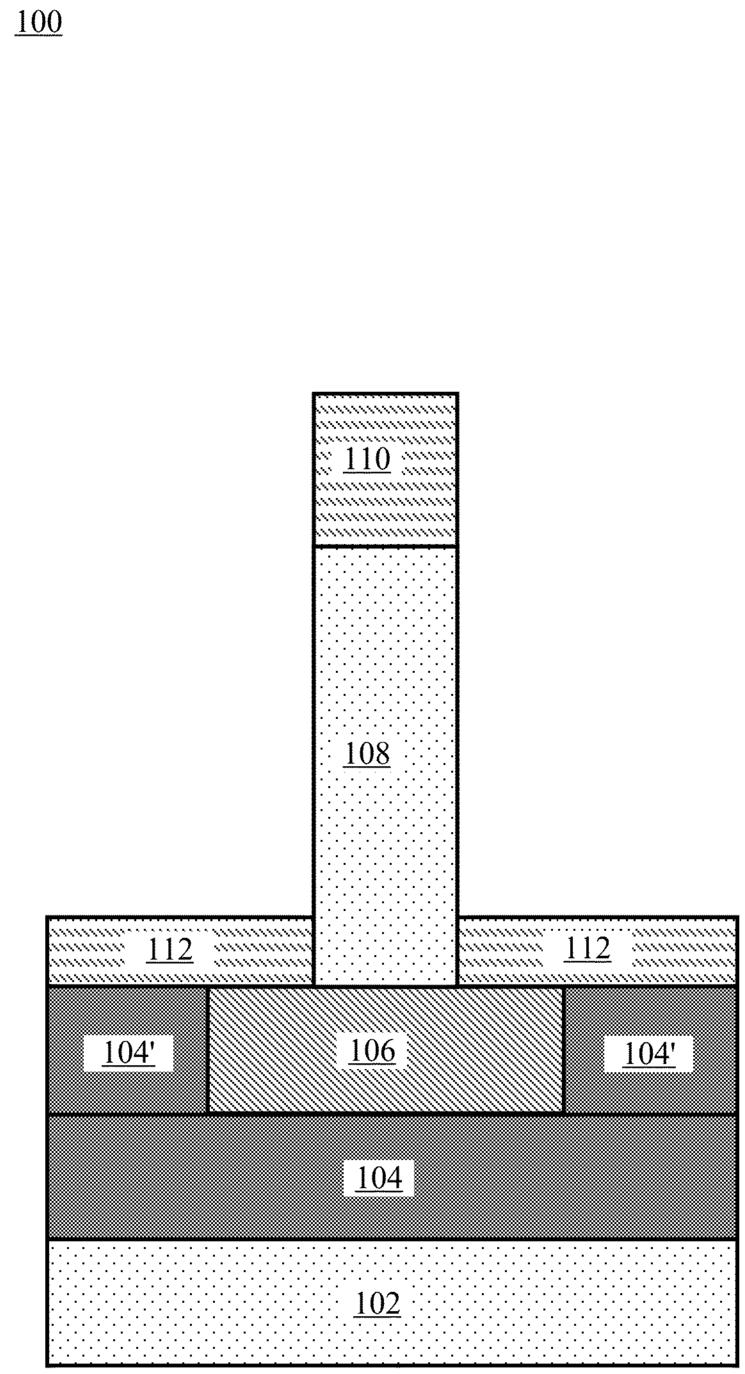

Referring now to FIG. 6, the semiconductor IC device 100 is depicted at a particular fabrication stage. At this fabrication stage, bottom spacer 112 is formed.

The bottom spacer 112 can be formed over the insulator layer 104', over the bottom S/D region 106, and/or around the vertical channel 108 by a blanket deposition technique, such as, but not limited to, CVD, PECVD, RFCVD, PVD, ALD, MLD, MBD, PLD, and/or liquid source LSMCD. The bottom spacer 112 may be composed of the same material as the sacrificial cap 110, as depicted, but may, in alternative implementations, be composed of a relatively different dielectric material, such as a low-K dielectric material (i.e., a dielectric material with a lower dielectric constant relative to $SiO_2$). For example, the bottom spacer 112 may be a silicon nitride, silicon oxide, or the like. The deposition process(es) and dielectric material selection may be controlled to achieve a predetermined vertical height or thickness of the bottom spacer 112 that provides for adequate electrical isolation between the bottom S/D region 106 and the logic-gate 116, depicted for example in FIG. 7.

In a non-limiting illustrative embodiment, a height or vertical thickness of the bottom spacer 112 can be in the range of about 10 nm to about 50 nm.

Figure 7:
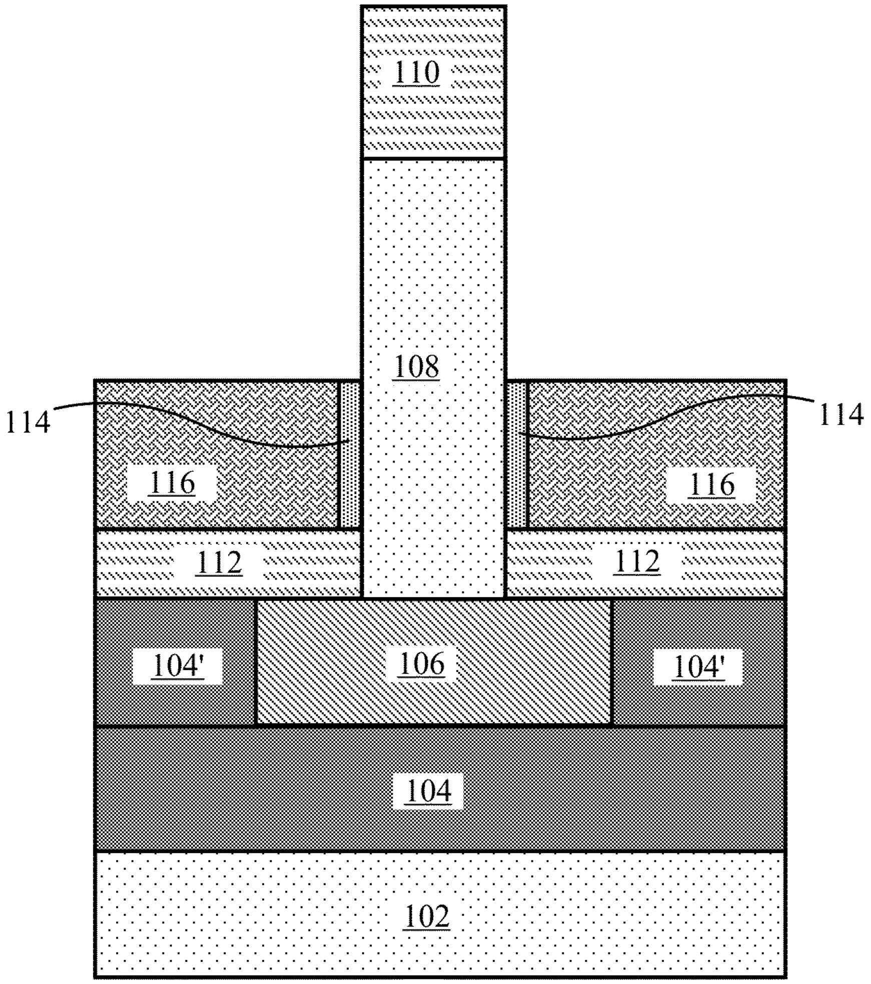

Referring now to FIG. 7, the semiconductor IC device 100 is depicted at a particular fabrication stage. At this fabrication stage, a logic-gate insulator 114 and a logic-gate 116 are formed.

The logic-gate insulator 114 may be formed by depositing a high-K dielectric layer over the bottom spacer 112, over the vertical channel 108, and/or over the sacrificial cap 110. The high-K dielectric layer can be deposited by any suitable techniques, such as ALD, CVD, metal-organic CVD (MOCVD), PVD, thermal oxidation, combinations thereof, or other suitable techniques. A high-K material can include e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The logic-gate 116 may be formed by depositing a single layer or multiple layers of conductive material(s), such as metal layer(s), liner layer(s), wetting layer(s), adhesion layer(s). The conductive material(s) can be deposited by a suitable deposition process, for example, chemical vapor deposition (CVD), plasma enhanced chemical vapor deposition (PECVD), physical vapor deposition (PVD), plating, thermal or e-beam evaporation, and/or sputtering. In embodiments, the logic-gate 116 can include, e.g., work-function metals, conductive materials such as Ti, Ag, Al, TiAlN, TaC, TaCN, TaSiN, Mn, Zr, TiN, TaN, Ru, Mo, Al, WN, Cu, W, or the like.

In some implementations, excess conductive material(s) and excess high-K dielectric layer material may be removed by one or more series of etches. In such process(es), one or more appropriate masks may be applied and patterned. An opening in the patterned mask(s) may expose the portions of the underlying conductive material(s) and excess high-K dielectric layer material to be removed while other protected portions of semiconductor IC device 100 under the mask(s) may be protected and retained. In such process(es), dry and/or wet etching processes can have etching parameters that can be tuned, such as etchants used, etch timing, etching temperature, etching solution concentration, etching pressure, source power, RF bias voltage, RF bias power, etchant flow rate, relative material selections to provide for etch selectivity, or the like, to promote desired material removal and desired material retention. Subsequently, a retained portion(s) of the high-K dielectric layer may form the logic-gate insulator 114 and a retained portion(s) of the conductive material(s) may form the logic-gate 116. In the depicted illustrative example, respective top surfaces of the logic-gate insulator 114 and the logic-gate 116 may be horizontal, substantially horizontal, coplanar, and/or substantially coplanar. Further, as depicted, respective top surfaces of the logic-gate insulator 114 and the logic-gate 116 may be substantially coplanar with or below a horizontal bisector of the vertical channel 108 to provide for adequate geometry for the formation of a memory cell 120 and an associated memory-gate 128, depicted for example in FIG. 9, therearound.

Certain high-K dielectric layer deposition techniques may be utilized to deposit such material generally upon the sidewalls of vertical channel 108. In these examples, the logic-gate insulator 114 may have a vertical orientation and may be directly upon the vertical channel 108 with a bottom surface thereof directly upon the bottom spacer 112, as depicted. Alternative high-dielectric layer deposition techniques may be utilized to deposit such material generally upon the sidewalls of vertical channel 108 and upon the top surface of the bottom spacer 112. In these examples, the logic-gate insulator 114 may have vertical portion with a vertical orientation direction upon the sidewall(s) of the vertical channel 108 and a horizontal portion with a horizontal portion directly upon the bottom spacer 112.

Figure 8:
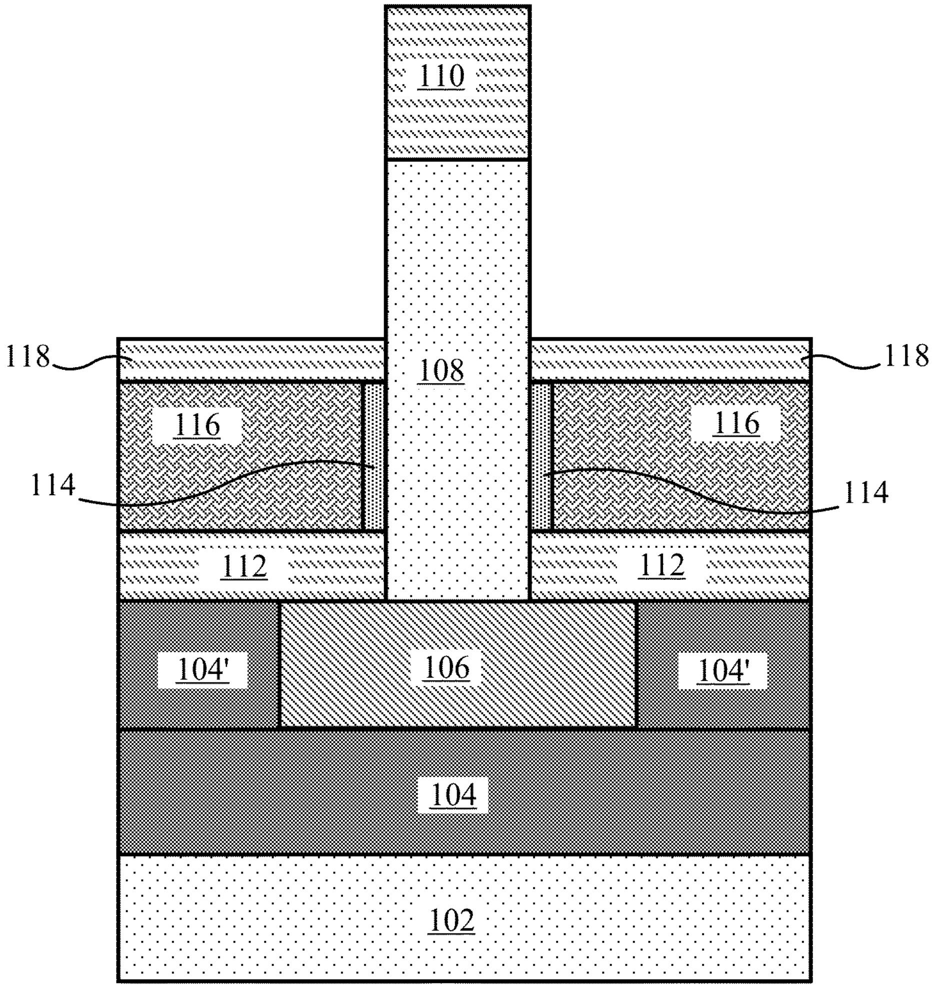

Referring now to FIG. 8, the semiconductor IC device 100 is depicted at a particular fabrication stage, in which a middle spacer 118 is formed.

The middle spacer 118 can be formed over the logic-gate insulator 114 and over the logic-gate 116, and/or around the vertical channel 108 by a blanket deposition technique, such as, but not limited to, CVD, PECVD, RFCVD, PVD, ALD, MLD, MBD, PLD, and/or liquid source LSMCD. The middle spacer 118 may be composed of the same material as the sacrificial cap 110, as depicted, but may, in alternative implementations, be composed of a relatively different dielectric material, such as a low-K dielectric material. For example, the middle spacer 118 may be a silicon nitride, silicon oxide, or the like. The deposition process(es) and dielectric material selection may be controlled to achieve a predetermined vertical height or thickness of the middle spacer 118 that provides for adequate electrical isolation between the logic-gate 116 and the memory-gate 128, depicted for example in FIG. 9.

In a non-limiting illustrative embodiment, a height or vertical thickness of the middle spacer 118 can be in the range of about 10 nm to about 50 nm.

Figure 9:
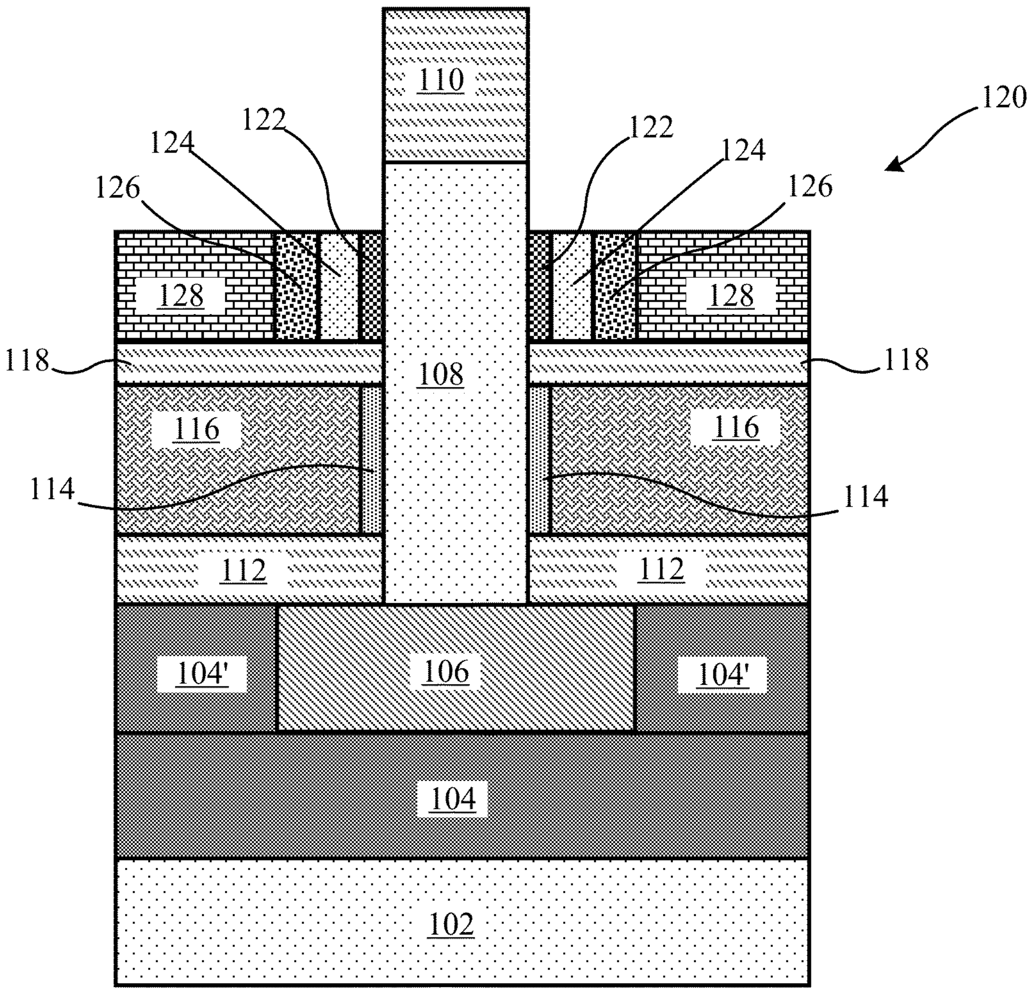

Referring now to FIG. 9, the semiconductor IC device 100 is depicted, at a particular fabrication stage, in which a memory cell 120 is formed and a memory-gate 128 is formed. The memory cell 120 may formed upon the middle spacer 118 and around the vertical channel 108, and the memory-gate 128 may be formed upon the middle spacer 118 and around the memory cell 120.

In the illustrated embodiment, the memory cell is an oxide-nitride-oxide (ONO) type of memory cell, though it is to be understood that other memory cell types may be utilized. Some types of ONO memory cells are, for example, semiconductor-oxide-nitride-oxide-semiconductor (SONOS) cell, metal-oxide-nitride-oxide-semiconductor (MONOS) cell, or the like. For clarity, the terms SONOS and MONOS denote basically the same type of memory cell except that polysilicon, is used as the SONOS gate conductor and a metal is used as the MONOS gate conductor) memory, as is illustratively depicted. These types of ONO cells are considered a viable replacement to floating gate memories, due to the moderate operating voltages these memories employ, e.g., approximately 5V. In such ONO memory cells, the memory state is represented by the charge stored in an insulator layer located between the control gate electrode and the device channel region. Depending on the programming conditions of the memory cells, it may be possible, for example, to lower the high voltage supply from 3.3V to 1.8V or even do away with the separate power supply altogether, thereby prolonging battery life. In addition, since ONO memories may utilize uniform tunneling for programming, reliability problems usually associated with floating gate memories, such as hot hole injection, are avoided.

However, traditionally, ONO memory cells are not immune to scaling concerns. The moderate voltages needed for programming put limits on the transistor design one can employ. Short-channel effects, including punch-through, can easily occur even at these voltages, if the device channel lengths are too short. Increasing channel doping concentrations to deter punch-through can lead to lower junction breakdown and destruction of any memory capability.

The scaling of traditional ONO memory cells has been limited to planar devices that are typically formed in bulk semiconductor substrates. The select gate and memory gate are typically formed separately and the cell sizes of these types of cells are usually large. In addition, the traditional planar ONO memory gate is typically constructed separately from any complementary metal oxide semiconductor (CMOS) gate process. Additional masks have been typically required above and beyond the CMOS process to create the typical ONO cell array. Due to the necessity of separating the ONO memory gate from CMOS processing, integration with high-performance CMOS devices has been traditionally costly.

The memory cell 120 may be formed by forming vertically orientated oxide-nitride-oxide (ONO) dielectric layers upon the middle spacer 118 and around the vertical channel 108. The memory cell 120 may include a tunneling oxide layer 122 that may have a horizontal thickness in the range of about 1.3 nm to about 4 nm. The tunneling oxide layer 122 can have a vertical orientation and can be in direct contact with to the sidewall(s) of the vertical channel 108 and can be in direct contact with to the top surface of the middle spacer 118. The tunneling oxide layer 122 can be formed utilizing a conventional deposition process such as CVD or PECVD or a thermal oxidation process can be used.

The memory cell 120 may further include a charge trapping nitride layer 124 that may have a horizontal thickness in the range of about 5 nm to about 15 nm. The charge trapping nitride layer 124 can have a vertical orientation and can be in direct contact with to the sidewall(s) of the tunneling oxide layer 122 and can be in direct contact with to the top surface of the middle spacer 118. The charge trapping layer 124 can be formed by a deposition process such, for example, PECVD or by a low-pressure chemical vapor deposition (LPCVD) process.

The memory cell 120 may further include a gate oxide layer 126 that may have a horizontal thickness in the range of about 2.5 nm to about 7.5 nm. The gate oxide layer 126 can have a vertical orientation and can be in direct contact with to the sidewall(s) of the charge trapping nitride layer 124 and can be in direct contact with to the top surface of the middle spacer 118. The gate oxide layer 126 can be formed by a deposition process including, for example, CVD or PECVD.

For clarity, certain deposition techniques may be utilized to deposit such ONO dielectric layer materials generally upon exposed vertical surface(s) while not depositing such material(s) upon exposed horizontal surfaces.

The memory-gate 128 may be formed by depositing a single layer or multiple layers of conductive material(s), such as metal layer(s), liner layer(s), wetting layer(s), adhesion layer(s). The conductive material(s) can be deposited by a suitable deposition process, for example, chemical vapor deposition (CVD), plasma enhanced chemical vapor deposition (PECVD), physical vapor deposition (PVD), plating, thermal or e-beam evaporation, and/or sputtering. In embodiments, the memory-gate 128 can include, e.g., work-function metals, conductive materials, such as Ti, Ag, Al, TiAlN, TaC, TaCN, TaSiN, Mn, Zr, TiN, TaN, Ru, Mo, Al, WN, Cu, W, or the like.

In some implementations, excess conductive material(s) and excess memory cell 120 materials may be removed by one or more series of etches. In such process(es), one or more appropriate masks may be applied and patterned. An opening in the patterned mask(s) may expose the portions of the underlying conductive material(s) and excess memory cell 120 material to be removed while other protected portions of semiconductor IC device 100 under the mask(s) may be protected and retained. In such process(es), dry and/or wet etching processes can have etching parameters that can be tuned, such as etchants used, etch timing, etching temperature, etching solution concentration, etching pressure, source power, RF bias voltage, RF bias power, etchant flow rate, relative material selections to provide for etch selectivity, or the like, to promote desired material removal and desired material retention. Subsequently, retained portion(s) of the memory cell 120 materials may form the memory cell 120 and a retained portion(s) of the conductive material(s) may form the memory-gate 128. In the depicted illustrative example, respective top surfaces of the memory cell 120 layers and the memory-gate 128 may be horizontal, substantially horizontal, coplanar, and/or substantially coplanar. Further, as depicted, respective top surfaces of the memory cell 120 layers and the memory-gate 128 may be substantially coplanar with or below the top surface of the vertical channel 108 to provide for adequate geometry for the formation of a top spacer 130, depicted for example in FIG. 10, thereupon or therearound.

Figure 10:
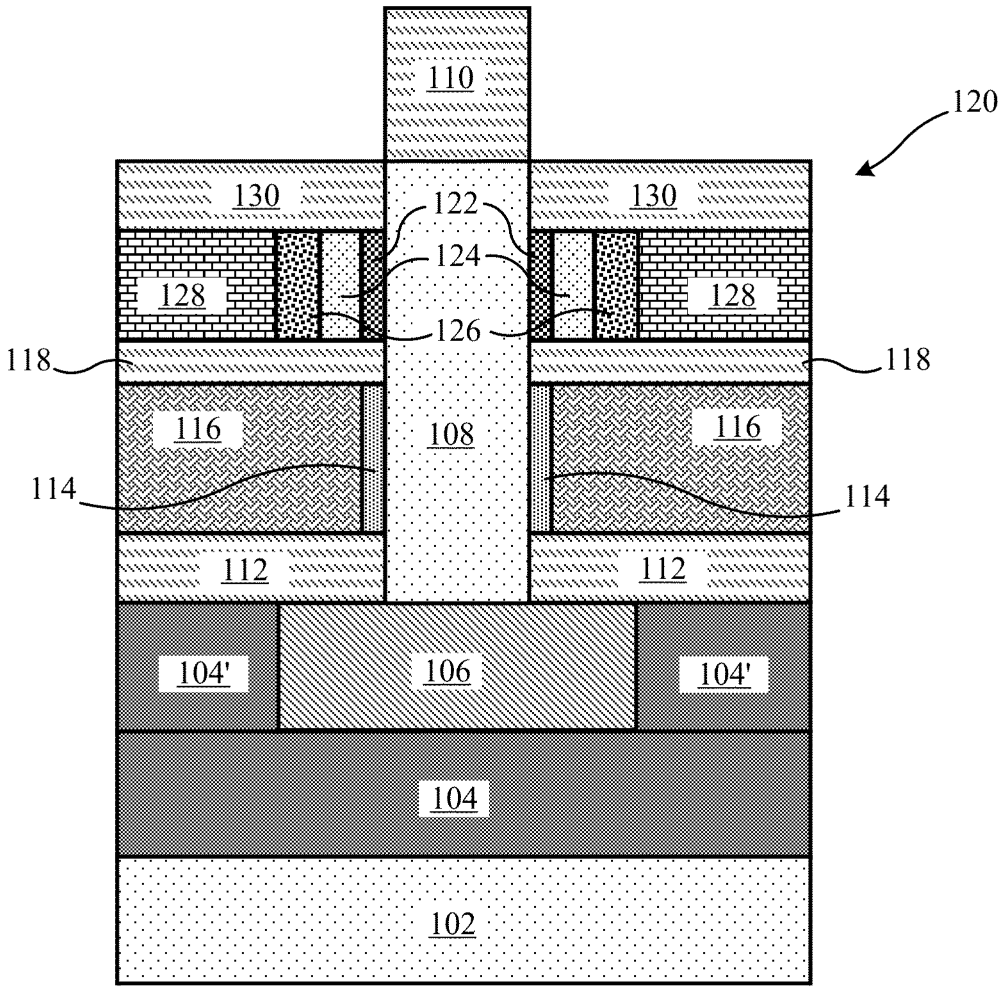

Referring now to FIG. 10, the semiconductor IC device 100 is depicted at a particular fabrication stage, in which a top spacer 130 is formed.

The top spacer 130 can be formed over the memory cell 120 and over the memory-gate 128, and/or around the vertical channel 108 by a blanket deposition technique, such as, but not limited to, CVD, PECVD, RFCVD, PVD, ALD, MLD, MBD, PLD, and/or liquid source LSMCD. The top spacer 130 may be composed of the same material as the sacrificial cap 110, as depicted, but may, in alternative implementations, be composed of a relatively different dielectric material, such as a low-K dielectric material. For example, the top spacer 130 may be a silicon nitride, silicon oxide, or the like. The deposition process(es) and dielectric material selection may be controlled to achieve a predetermined vertical height or thickness of the top spacer 130 that provides for adequate electrical isolation between the memory-gate 128 or memory cell 120 and the top S/D region 136, depicted for example in FIG. 13.

Figure 11:
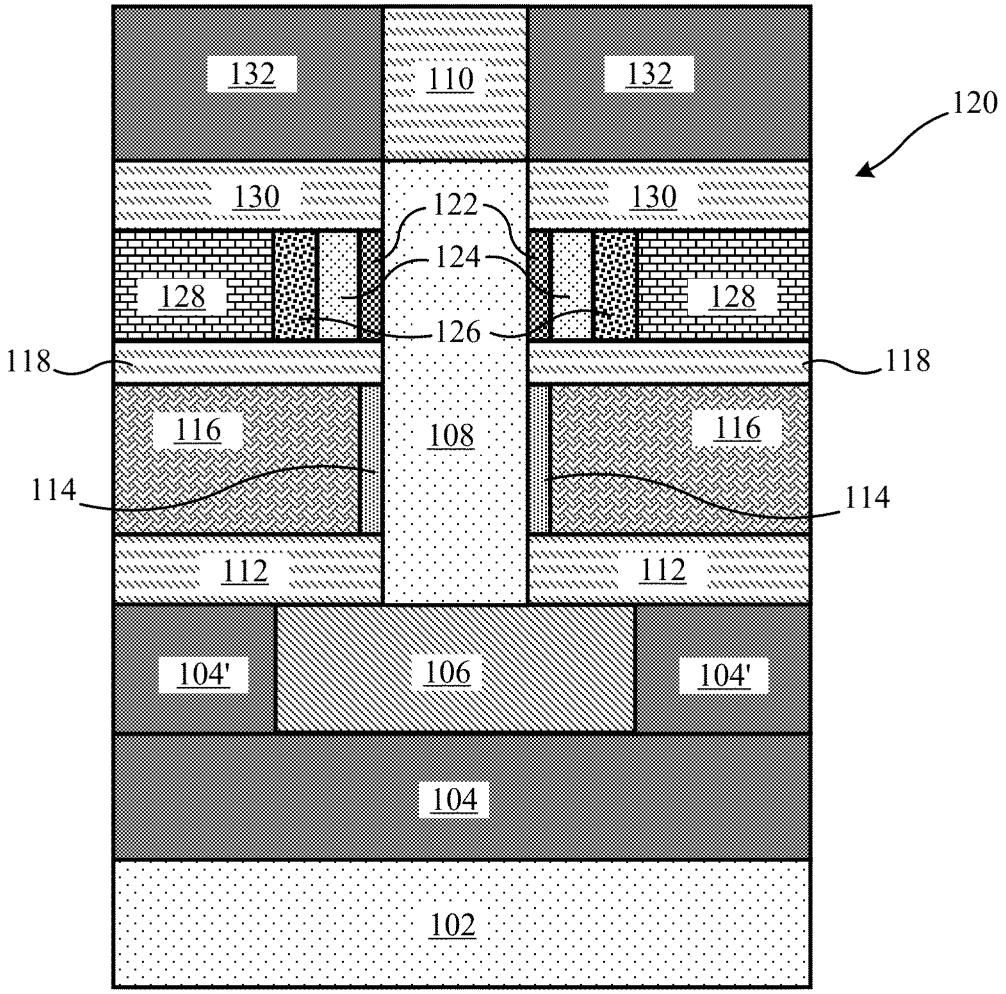

Referring now to FIG. 11, the semiconductor IC device 100 is depicted at a particular fabrication stage, in which an insulator layer 132 is formed. The insulator layer 132 may formed over the top spacer 130 and over the sacrificial cap 110 by depositing a dielectric material thereupon. The insulator layer 132 may be composed of the same material as the insulator layer 104, as depicted, but may, in alternative implementations, be composed of a relatively different dielectric material. The dielectric material can be deposited using deposition techniques including, but not limited to, CVD, PECVD, RFCVD, PVD, ALD, MLD, MBD, PLD, and/or LSMCD, followed by a planarization process, such as chemical mechanical polish (CMP) to remove excess insulator layer 132 material. After the planarization process, a top surface of the insulator layer 132 and a top surface of the sacrificial cap 110 may be horizontal, substantially horizontal, coplanar, and/or substantially coplanar.

Figure 12:
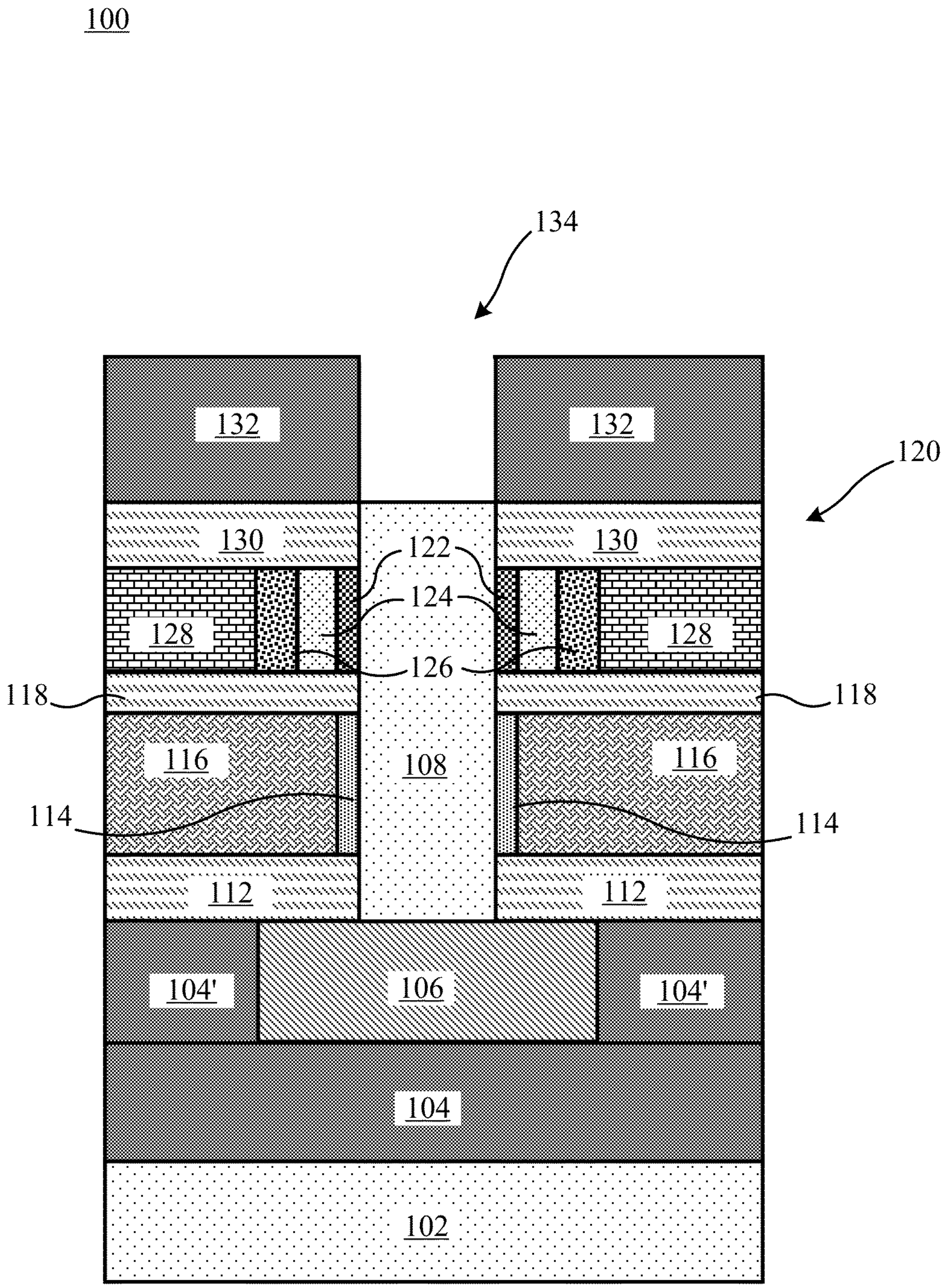

Referring now to FIG. 12, that depicts semiconductor IC device 100 at a particular fabrication stage, in which a sacrificial cap 110 is removed. The sacrificial cap 110 may be removed by a substrative removal technique such as an etch, a selective etch, or the like. For example, semiconductor IC device 100 may be exposed to an etchant that removes the material of sacrificial cap 110 selective to the insulator layer 132, the vertical channel 108, or the like. After the removal of sacrificial cap 110, an opening 134 is formed above the vertical channel 108. In other words, the removal of the sacrificial cap 110 exposes at least a portion of the top surface of the vertical channel 108.

The opening 134 may be formed by one or more etch process(es). In such process(es), such as dry etching processes, wet etching processes, or the like can have etching parameters that can be tuned, such as etchants used, etching temperature, etching solution concentration, etching pressure, source power, RF bias voltage, RF bias power, etchant flow rate, to promote sacrificial cap 110 removal and insulator layer 132 and vertical channel 108 retention.

Figure 13:
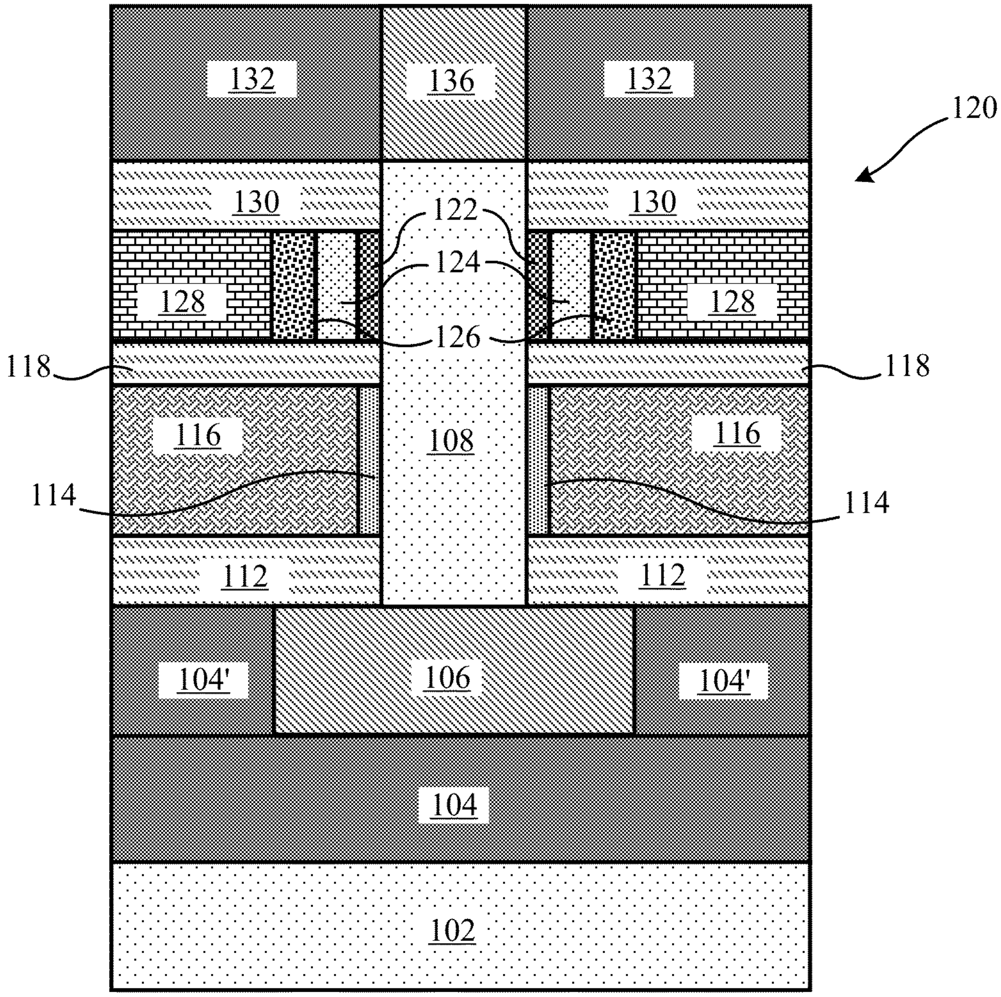

Referring now to FIG. 13, the semiconductor IC device 100 is depicted at a particular fabrication stage, in which a top S/D region 136 is formed. The top S/D region 136 may formed within the opening 134 over the vertical channel 108. The top S/D region 136 is generally a semiconductor material, such as silicon (Si) or silicon germanium (SiGe) that includes a dopant. The dopant that is present in the top S/D region 136 can be either a p-type dopant or an n-type dopant. The term "p-type" refers to the addition of impurities to an intrinsic semiconductor that creates deficiencies of valence electrons.

In a silicon-containing semiconductor material, examples of p-type dopants, i.e., impurities, include, but are not limited to, boron, aluminum, gallium, phosphorus and indium. "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the top S/D region 136 can have a dopant concentration of from $4\times10^{20}$ atoms/cm$^3$ to $3\times10^{21}$ atoms/cm$^3$.

According to an embodiment, the top S/D region 136 is epitaxially grown. In some epitaxial growth operations, as presently depicted, epitaxial growth and/or deposition processes may be selective to forming on a semiconductor surface, such as the top surface of vertical channel 108, and does not deposit material on dielectric surfaces, such as silicon dioxide or silicon nitride surfaces.

In some examples, the top S/D region 136 is formed by in-situ doped epitaxial growth. Alternatively, the top S/D region 136 can be formed by deposition techniques, such as, for example, including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD).

In some examples, the top S/D region 136 may be a drain region and may be doped with an n-type dopant atom or a p-type dopant atom. The implant energies used in forming the drain region may be typically from about 10 to about 40 keV and ion doses from about 1E15 to about 5E15 atoms/cm$^2$ are typically used to form a heavily doped region. An annealing step may follow the ion implantation or dopant operations.

Following the formation of the top S/D region 136, a planarization process, such as, chemical mechanical polish (CMP) may remove excess top S/D region 136 material. After the planarization process, a top surface of the insulator layer 132 and a top surface of the top S/D region 136 may be horizontal, substantially horizontal, coplanar, and/or substantially coplanar.

Figure 14:
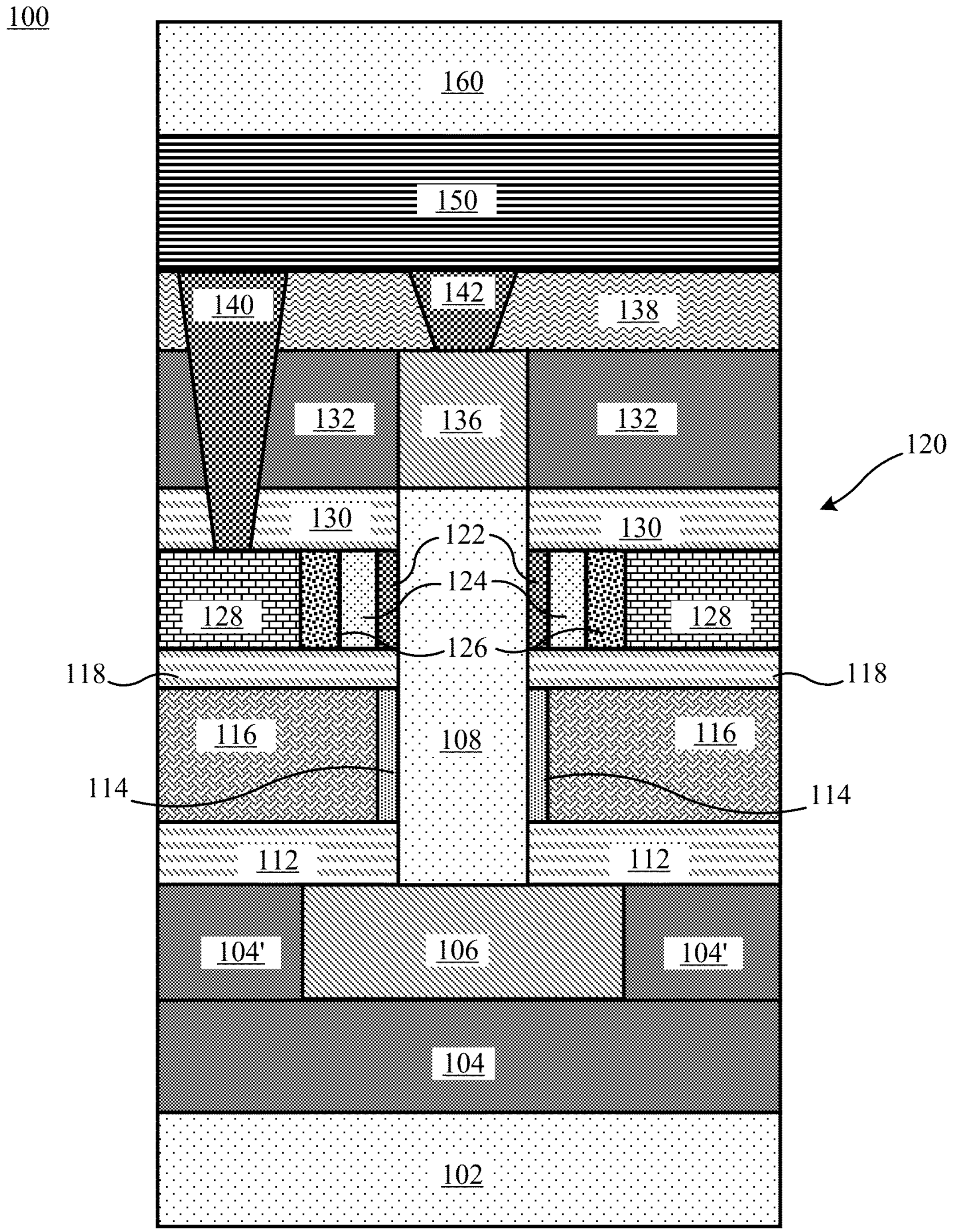

Referring now to FIG. 14, the semiconductor IC device 100 is depicted at a particular fabrication stage, in which a frontside contact 140, a frontside contact 142, and a frontside back end of line (BEOL) network 150 are formed. Further, at the present fabrication stage, a carrier wafer 160 may be bonded to the semiconductor IC device 100.

At the present fabrication stage, semiconductor IC device 100 includes three sections: a front-end-of-line (FEOL) section in which the logic microdevice and the memory microdevice are formed, a frontside back-end-of-line (BEOL) network 150, and a section that connects those two together, the middle-of-line (MOL) section. The FEOL section includes the active microdevices, such as a logic microdevice transistor that may include the bottom S/D region 106, the top S/D region 136, the vertical channel 108, and logic-gate 116 and a memory microdevice that may include the bottom S/D region 106, the top S/D region 136, the vertical channel 108, the memory cell 120, and the memory-gate 128.

The frontside BEOL network 150 may include interconnects, wiring, and material(s) to prevent undesired current flow between conductive features therein. The MOL includes interconnects between the FEOL section and the BEOL network 150 and further includes material(s) to prevent the diffusion of frontside BEOL network 150 conductive material(s) into FEOL active microdevices.

After the FEOL fabrication stages, one or more MOL structures may be formed by depositing an interlayer dielectric (ILD) 138 upon the insulator layer 132 and upon the top S/D region 136. The ILD 138 may be formed over the insulator layer 132 and over the top S/D region 136 by depositing a dielectric material, such as, for example, porous silicates, carbon doped oxides, silicon dioxides, silicon nitrides, silicon oxynitrides, or other dielectric materials. Any appropriate deposition technique for forming the ILD 138 can be utilized. The ILD 138 can be formed using, for example, CVD, PECVD, ALD, flowable CVD, spin-on dielectrics, or PVD.

The frontside contact(s) 140, 142 may be formed by patterning respective frontside contact openings within ILD 138 from the frontside (i.e., from above the semiconductor IC device 100, as depicted, downward to respective structures thereof). The frontside contact opening(s) may be formed by the same or shared lithography and etch process(es), or sequential lithography and etch processes. In such process(es), a mask may be applied and patterned. An opening in the patterned mask may expose the portion of the underlying ILD 138 to be removed while other protected portions of semiconductor IC device 100 thereunder may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, to promote desired material removal and desired material retention. For example, a first frontside opening in association with frontside contact 140 may be formed by the removal of respective portions of ILD 138, insulator layer 132, and top spacer 130. This first frontside opening may expose a portion of the top surface of memory-gate 128. Similarly, a second frontside opening in association with frontside contact 142 may be formed by the removal of respective portions of ILD 138. This second frontside opening may expose a portion of the top surface of top S/D region 136.

The frontside contact(s) 140, 142 may be further formed by depositing conductive material such as metal into the respective frontside contact opening(s). In an example, frontside contact(s) 140, 142 may be formed by depositing a liner, such as Ni, NiPt, Ti, etc., into the contact opening(s), depositing a metal adhesion liner, such as TiN, TaN, etc., upon the liner, and by depositing a conductive metal fill, such as Al, Ru, W, Co, Cu, etc., upon the metal adhesion liner. Subsequently, a planarization process, such as a CMP process or a mechanical grinding process, may remove excess portions of the conductive material(s). Subsequently, the respective top surfaces of frontside contact(s) 140, 142 and the ILD 138 may be coplanar.

The frontside contact(s) 140, 142 may be in direct or indirect physical and electrical contact and/or may physically meld with respective material(s) of one or more regions of the top microdevice within the FEOL of the semiconductor IC device 100. For example, frontside contacts 140, 142 may be in electrical contact with memory-gate 128 and top S/D region 136, respectively.

The frontside BEOL network 150 includes contacts, insulating layers (e.g., dielectrics, or the like), metal levels, and conductive pads for chip-to-package connections. In the frontside BEOL network 150 fabrication stages, sequential metal levels (e.g., M.0 through M.X, wherein X is an integer starting from one, or the like) of a respective dielectric layer having one or more conductive wires therein are formed. Sequential via levels (e.g., V.1 through V.X, or the like) of a respective dielectric layer having one or more conductive via interconnects therein are formed to connect the predetermined conductive wires located within metal levels there above and there below. The metal levels, via levels, and associated dielectric layer(s) may be formed, for example, using single damascene or dual-damascene processes. A lowest via level (e.g., V.0) may connect the frontside BEOL network 150 to the MOL frontside contact(s) 140, 142. For clarity, a first conductive pathway formed of one or more conductive wires within one or more metal levels may be connected to frontside contact 140 and a second conductive pathway formed of one or more different conductive wires within one or more metal levels may be connected to frontside contact 142.

The carrier wafer 160 may be bonded to the frontside BOEL network 150 of the semiconductor IC device 100 and can include one of the semiconductor materials mentioned above for the semiconductor structure. Carrier wafer 160 may be bonded to or otherwise attached to the semiconductor IC device 100 by a wafer-to-wafer bonding technique.

Figure 15:
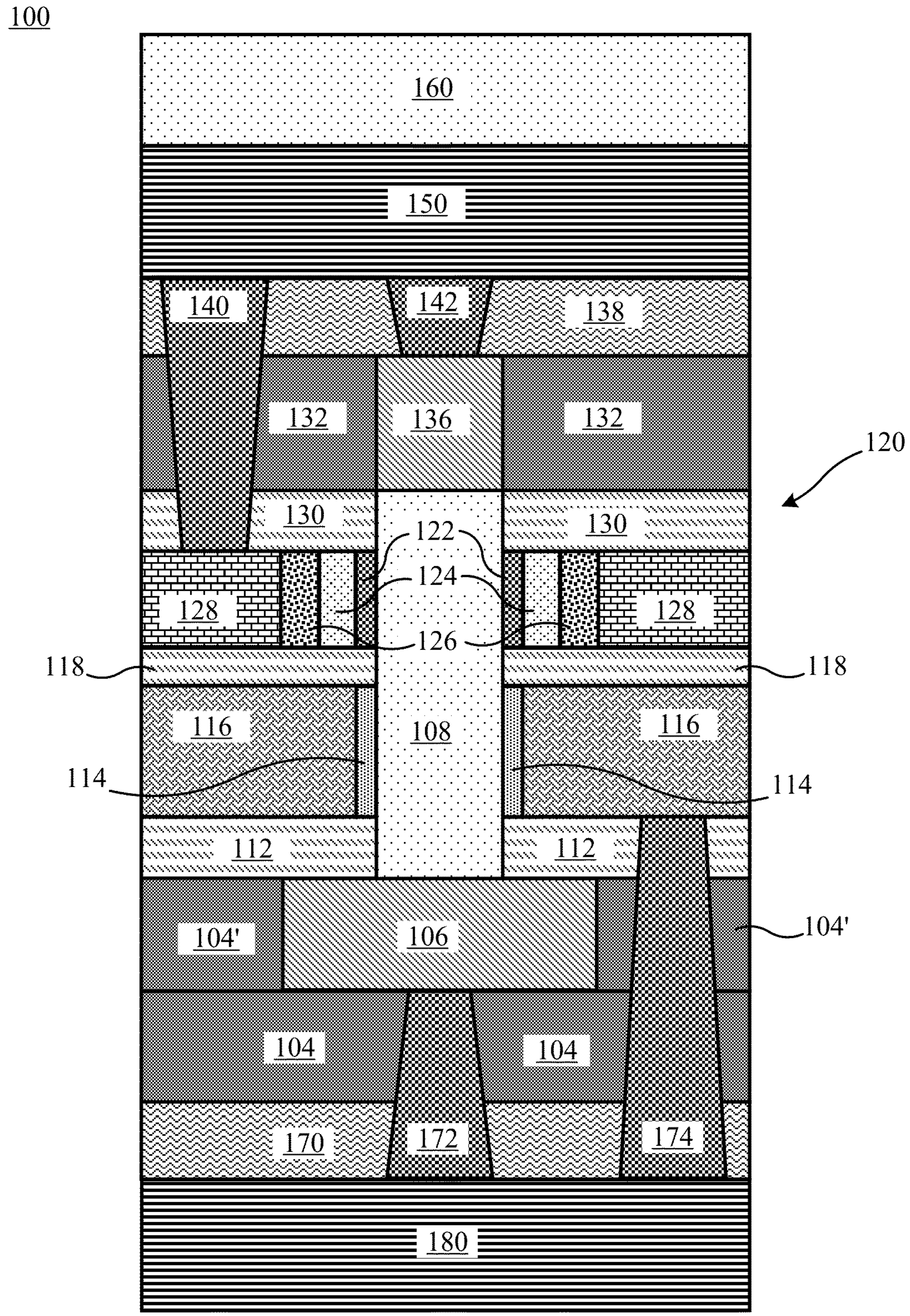

Referring now to FIG. 15, the semiconductor IC device 100 is depicted at a particular fabrication stage, in which the semiconductor IC device 100 may be flipped (not shown), the substrate 102 may be removed, a backside ILD 170 may be formed, backside contacts 172, 174 may be formed, and a backside BEOL network 180 may be formed.

The substrate 102 may be removed by any removal technique, such as a combination of wafer grinding, CMP, dry etch and wet etch. In the example depicted, substrate 102 is removed by an etch that utilizes insulator layer 104 as an etch stop. In this example, removal of substrate 102 exposes the bottom surface of insulator layer 104.

Further, in the depicted fabrication stage, backside ILD 170 may be formed upon the bottom surfaces (as depicted) of insulator layer 104. The backside ILD 170 may be formed by depositing a dielectric material, such as, for example, porous silicates, carbon doped oxides, silicon dioxides, silicon nitrides, silicon oxynitrides, or other dielectric materials. Any appropriate deposition technique for forming the backside ILD 170 can be utilized. The backside ILD 170 can be formed using, for example, CVD, PECVD, ALD, flowable CVD, spin-on dielectrics, or PVD. For clarity, in some examples, ILD 170 need not be formed and the insulator layer 104 serves as the backside ILD layer into which backside contacts may be formed.

Further, in the depicted fabrication stage, backside contact openings may be formed through backside ILD 170. The backside contact openings may be formed from the backside (i.e., from below the semiconductor IC device 100, as depicted, upward to respective structures thereof). The backside contact opening(s) may be formed by the same or shared lithography and etch process(es), or sequential lithography and etch processes. In such process(es), a mask may be applied and patterned. An opening in the patterned mask may expose the portion of the above ILD 170 to be removed while other protected portions of semiconductor IC device 100 thereabove may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, to promote desired material removal and desired material retention. For example, a first backside opening in association with backside contact 174 may be formed by the removal of respective portions of ILD 170, insulator layer 104, and bottom spacer 112. This first backside opening may expose a portion of the bottom surface of logic-gate 116. Similarly, a second backside opening in association with backside contact 172 may be formed by the removal of respective portions of ILD 170 and insulator layer 104. This second frontside opening may expose a portion of the bottom surface of bottom S/D region 106.

Further, in the depicted fabrication stage, a backside contact 172, 174 may be formed within an associated backside contact opening. Backside contact(s) 172, 174 may be further formed by depositing conductive material such as metal into the respective frontside contact opening(s). In an example, backside contact(s) 172, 174 may be formed by depositing a liner, such as Ni, NiPt, Ti, etc. into the contact opening(s), depositing a metal adhesion liner, such as TiN, TaN, etc. upon the liner, and by depositing a conductive metal fill, such as Al, Ru, W, Co, Cu, etc. upon the metal adhesion liner. Subsequently, a planarization process, such as a CMP process or a mechanical grinding process, may remove excess portions of the conductive material(s). Subsequently, the respective bottom surfaces of backside contact(s) 172, 174 and the ILD 170 may be coplanar.

The backside contact(s) 172, 174 may be in direct or indirect physical and electrical contact and/or may physically meld with respective material(s) of one or more regions of the bottom microdevice within the FEOL of the semiconductor IC device 100. For example, backside contacts 172, 174 may be in electrical contact with logic-gate 116 and bottom S/D region 106, respectively.

Further, in the depicted fabrication stage, a backside BEOL network 180 may be formed. The backside BEOL network 180 may be formed over the backside ILD 170 and upon the one or more backside contacts 172, 174. The backside BEOL network 180 may be indirectly electrically and/or indirectly physically connected the bottom microdevice within the FEOL section of the semiconductor IC device 100. For example, the BEOL network 180 may be electrically connected to the bottom S/D region 106 and to the logic-gate 116. The backside BEOL network 180 is located generally upon or otherwise further forms the backside of the semiconductor IC device 100.

The backside BEOL network 180 can include one or more interconnect dielectric material layers (including one of the dielectric materials mentioned above for the ILD layer 138) and contains backside metal wires embedded therein. In some embodiments, the backside metal wires within the backside BEOL network 180 are composed of Cu. The backside BEOL network 180 can include "x" numbers of backside metal levels, wherein "x" is an integer starting from 1. If not included in frontside BEOL network 150, backside BEOL network 180 may further contain conductive pads that are connected to one or more of the backside metal wires and may be used to connect the semiconductor IC device 100 to the external and/or higher-level structure. The metal levels, via levels, and associated dielectric layer(s) may be formed, for example, using single damascene or dual-damascene processes. A lowest via level (e.g., V.0) may connect the backside BEOL network 180 to the backside contact(s) 172, 174. For clarity, a first conductive pathway within the backside BEOL network 180 that is formed of one or more conductive wires within one or more metal levels may be connected to backside contact 174 and a second conductive pathway within the BEOL network 180 that is formed of one or more different conductive wires within one or more metal levels may be connected to backside contact 172.

In an example, signal routing and power routing is effectively split between the frontside BEOL network 150 and the backside BEOL network 180. For example, at least 90% of the frontside metal wires (e.g., furthest from the FEOL section are signal routing metal wires and the remainder frontside metal wires which are usually present in metal levels closest to the microdevices within the FEOL, can be used as power routing wires. Further in this example, at least 90% of the backside metal wires that are in metal levels closest to the microdevices within the FEOL are power routing metal wires and the remainder backside metal wires which are usually present in metal levels furthest away from the FEOL section, can be used as signal routing wires. Power routing wires may be less dense signal routing wires. A signal routing wire is defined herein as a conductive feature, such as a wire, trace, or the like, that is configured to electrically carry a functional or logical potential or signal that is to change or is otherwise dynamic over time. A power routing wire is defined herein as a conductive feature, such as a wire, trace, plane, or the like, that is configured to electrically carry power potential. For example, a power routing wire carries or otherwise has a functional power potential, such as VDD, VSS, or the like. For clarity, in some examples, the backside BEOL network 180 may be a backside power distribution network (BSPDN).

For clarity, semiconductor IC device that includes a logic microdevice and a memory microdevice that share the same vertical channel 108. The logic microdevice and the memory microdevice may be separated by the middle spacer 118. The memory microdevice may be above the logic microdevice. In other words, the memory microdevice may be nearest and/or connected to the frontside of the semiconductor IC device 100 and the logic microdevice may be nearest and/or connected to a backside of the semiconductor IC device 100.

The memory microdevice may further include the memory-gate 128 and a memory cell 120. One sidewall of the memory cell 120 may be in direct contact with to the sidewall(s) of the vertical channel 108 and a distal sidewall of the memory cell 120 may be in direct contact with to a sidewall of the memory-gate 128. The memory cell 120 may be an ONO type memory cell and include the tunneling oxide layer 122, the charge trapping nitride layer 124, and the gate oxide layer 126.

The logic microdevice may further include the logic-gate 116 and logic-gate insulator 114. One sidewall of the logic-gate insulator 114 may be in direct contact with to a sidewall of the vertical channel 108 and a distal sidewall of the logic-gate insulator 114 may be in direct contact with to a sidewall of the logic-gate 116.

The vertical channel 108 may be directly between the top S/D region 136 and the bottom S/D region 106. For example, a top surface of the vertical channel 108 may be in direct contact with to a bottom surface of the top S/D region 136 and a bottom surface of the vertical channel 108 may be in direct contact with to a top surface of the bottom S/D region 106. In one example, as depicted, the top S/D region 136 may be self-aligned to the vertical channel 108. As a result, one or more sidewall(s) of the top S/D region 136 may be coplanar or substantially coplanar with respective one or more sidewall(s) of the vertical channel 108. In this example, parasitic capacitance between the top S/D region 136 and the memory microdevice may be relatively reduced compared to other examples where the top S/D region is wider than the vertical channel.

In one example, as depicted, the one or more sidewall(s) of the vertical channel 108 are inset with respect to respective sidewall(s) of the bottom S/D region 106. In this example, fabrication complexities of forming the bottom S/D region 106 may be eased if the bottom S/D region 106 is relatively wider than the vertical channel 108. For instance, the top surface of the bottom S/D region 106 may be used as an etch stop in subsequent semiconductor IC device 100 fabrication operations.

In an example, the semiconductor IC device 100 further includes the frontside BEOL network 150 and the backside BEOL network 180. The frontside BEOL network 150 may be electrically connected to the topmost microdevice (e.g., the memory microdevice) by one or more frontside contacts 140, 142. For example, the memory-gate 128 and a first conductive pathway within the frontside BEOL network 150 may each be in direct contact with to the frontside contact 140. Similarly, the top S/D region 136 and a second conductive pathway within the frontside BEOL network 50 may each be in direct contact with to the frontside contact 142.

The backside BEOL network 180 may be electrically connected to the bottom microdevice (e.g., the logic microdevice 14) by one or more backside contacts 172, 174. For example, as depicted, the logic-gate 116 and a first conductive pathway within the backside BEOL network 180 may each be in direct contact with to the backside contact 174. Similarly, the bottom S/D region 106 and a second conductive pathway within the backside BEOL network 70 may each be in direct contact with to the backside contact 172.

In an example, the frontside contact 142, the top S/D region 136, the vertical channel 108, the memory cell 120, the memory-gate 128, the logic-gate insulator 114, the logic gate 116, the bottom S/D region 106, and/or the backside contact 172 may be vertically inline (e.g., share the same or substantially a same vertical bisector or vertical axis of symmetry). The horizontal dimensions from the vertical bisector or vertical axis of symmetry of the various structures of the semiconductor IC device 100 may be minimized, to reduce the footprint of such structures, to allow for further scaling of the semiconductor IC device 100.

Semiconductor IC device 100 may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher-level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

Figure 16:
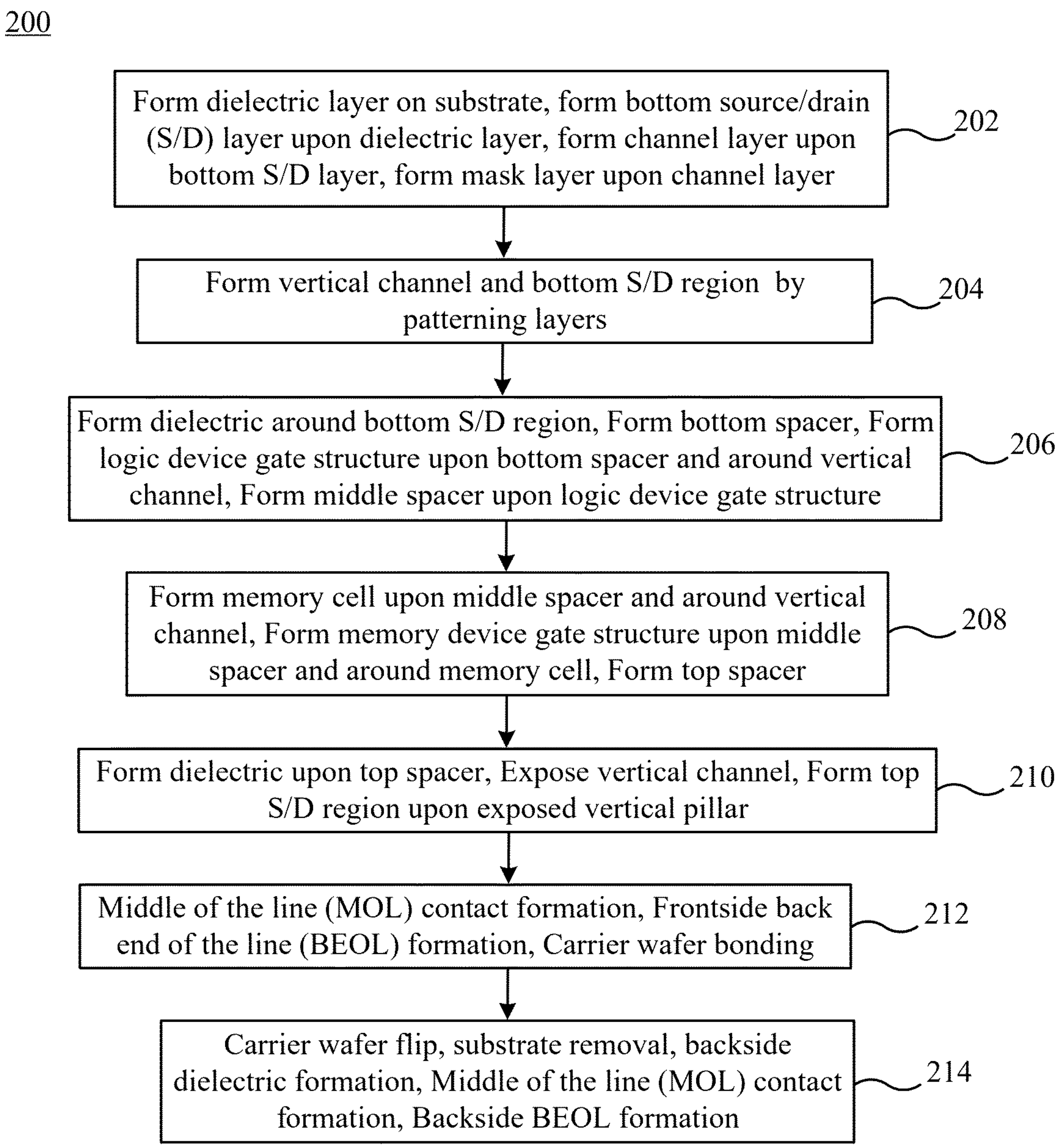
FIG. 16 depicts a flowchart of a method of fabricating a semiconductor IC device that includes a logic microdevice and memory microdevice that share a common vertical channel, according to one or more embodiments of the disclosure.

FIG. 16 depicts a flow diagram illustrating method 200 to fabricate a semiconductor IC device, such as semiconductor IC device 100. The depicted fabrication operations of method 200 are illustrated and described above with reference to one or more of FIG. 2 through FIG. 15 of the drawings, which describe the fabrication of semiconductor IC device 100, though the fabrication operations described in method 200 may be used to fabricate other types of semiconductor IC devices. The method 200 depicted herein is illustrative. There can be many variations to the diagram or operations described therein without departing from the spirit of the embodiments. For instance, the operations can be performed in a differing order, or operations can be added, deleted, or modified.

At block 202, method 200 may begin with forming a dielectric layer upon a substrate, with forming a bottom source/drain (S/D) layer upon the dielectric layer, with forming a channel layer upon the bottom S/D layer, and with forming a mask layer upon the channel layer. For example, an insulator layer 104 may be formed over a substrate 102, a bottom S/D layer 106' may be formed over the insulator layer 104, a channel layer 108' may be formed over the bottom S/D layer 106', and a capping layer 110' may be formed over the channel layer 108'.

At block 204, method 200 may continue with forming a vertical channel and with forming a bottom S/D region by patterning the mask layer, the channel layer, and the bottom S/D layer. For example, sacrificial cap 110, vertical channel 108, and bottom S/D region 106 are formed by patterning the mask layer 110', the channel layer 108', and the bottom S/D layer 106'.

At block 206, method 200 may continue with forming a dielectric around the bottom S/D region, with forming a bottom spacer, with forming a logic microdevice gate structure upon the bottom spacer and around the vertical channel, with forming a middle spacer upon the logic microdevice gate structure. For example, insulator layer 104' may be formed over the insulator layer 104 and around the bottom S/D region 106. Next, for example, bottom spacer 112 may be formed over the insulator layer 104', over the bottom S/D region 106, and around the vertical channel 108. Next, for example, logic-gate insulator 114 may be formed around the vertical channel 108 and the logic-gate 114 may be formed upon the logic-gate insulator 114 and upon the bottom spacer 112. Next, for example, middle spacer 118 may be formed upon the logic-gate 116, upon the logic-gate insulator 114, and around the vertical channel 108.

At block 208, method 200 may continue with forming a memory cell upon the middle spacer and around the vertical channel, with forming a memory microdevice gate structure upon the middle spacer and around the vertical channel, and with forming a top spacer upon the memory cell, upon the memory microdevice gate structure, and around the vertical channel. For example, memory cell 120 may be formed upon the middle spacer 118 and around the vertical channel 108. Next, for example, memory-gate 128 may be formed upon the middle spacer 118 and around the memory cell 120. Next, for example, top spacer 130 may be formed upon the memory cell 120, upon the memory-gate 128, and around the vertical channel 108.

At block 210, method 200 may continue with forming a dielectric upon the top spacer, within exposing at least a portion of the vertical channel, with forming a top S/D region upon the exposed portion of the vertical channel. For example, insulator layer 132 may formed upon the top spacer 130 and around the sacrificial cap 110. Next, for example, sacrificial cap 110 may be removed and forms the opening 134 that exposes at least a portion of the top surface of the vertical channel 108. Next, for example, the top S/D region 136 may be formed upon the exposed top surface of the vertical channel 108 within the opening 134.

At block 212, method 200 may continue with MOL frontside contact formation, with frontside BEOL network formation, and with carrier wafer bonding. For example, ILD 138 may be formed upon insulator layer 132 and upon the top S/D region 136. Next, for example, frontside contact openings may be formed within at least the ILD 138. A first frontside contact opening may be formed within the ILD 138, within the insulator layer 132, and within the top spacer 130 and may expose a portion of the top surface of memory-gate 128. A second frontside contact opening may be formed within the ILD 138 and may expose a portion of the top surface of top S/D region 136. Next, for example, the frontside contact 140 may be formed within the first frontside contact opening and the frontside contact 142 may be formed within the second frontside contact opening. Next, for example, frontside BEOL network 150 may be formed upon the ILD 138 and upon the frontside contacts 140, 142. A first conductive pathway within the BEOL network 150 may be electrically connected to the frontside contact 140 and a second conductive pathway within the BEOL network 150 may be electrically connected to the frontside contact 142. Next, for example, carrier wafer 160 may be bonded to the frontside of the semiconductor IC device (e.g., to the top surface of the frontside BEOL network 150).

At block 214, method 200 may continue with flipping the carrier wafer, with backside dielectric formation, with backside MOL contact formation, and with backside BEOL network formation. For example, substrate 102 may be removed and, in some implementations, insulator layer 104 may also be removed. Next, for example, backside 170 may be formed upon the backside of the semiconductor IC device (e.g., upon the backside of insulator layer 104, upon the backside of insulator layer 104' and upon the backside of bottom S/D region 106). Next, for example, backside contact openings may be formed within at least the backside ILD 170. A first backside contact opening may be formed within the backside ILD 170, within the insulator layer 104, and within the bottom spacer 112 and may expose a portion of the bottom surface of logic-gate 116. A second backside contact opening may be formed within the backside ILD 170 and within the insulator layer 104 and may expose a portion of the bottom surface of bottom S/D region 106. Next, for example, the backside contact 174 may be formed within the first backside contact opening and the backside contact 172 may be formed within the second frontside contact opening. Next, for example, backside BEOL network 180 may be formed upon the backside ILD 170 and upon the backside contacts 172, 174. A first conductive pathway within the backside BEOL network 180 may be electrically connected to the backside contact 174 and a second conductive pathway within the backside BEOL network 180 may be electrically connected to the backside contact 172.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor integrated circuit (IC) device comprising:

a vertical channel;

a memory microdevice connected to the vertical channel, the memory microdevice comprising a memory cell in direct contact with to a sidewall of the vertical channel; and a logic microdevice connected to the vertical channel, the logic microdevice comprising a logic-gate insulator in direct contact with to the sidewall of the vertical channel, wherein a distal sidewall of the logic-gate insulator is in direct contact with to a sidewall of a logic-gate.

2. The semiconductor IC device of claim 1, wherein the memory microdevice further comprises:

a memory-gate in direct contact with to a sidewall of the memory cell.

3. The semiconductor IC device of claim 2, further comprising:

a top source/drain in direct contact with to a top surface of the vertical channel.

4. The semiconductor IC device of claim 3, further comprising:

a bottom source/drain in direct contact with to a bottom surface of the vertical channel.

5. The semiconductor IC device of claim 4, further comprising:

a first frontside contact in direct contact with to a top surface of the memory-gate.

6. The semiconductor IC device of claim 5, further comprising:

a second frontside contact in direct contact with to a top surface of the top source/drain.

7. The semiconductor IC device of claim 6, further comprising:

a first backside contact in direct contact with to a bottom surface of the logic-gate.

8. The semiconductor IC device of claim 7, further comprising:

a second backside contact in direct contact with to a bottom surface of the bottom source/drain.

9. The semiconductor IC device of claim 8, further comprising:

a frontside back end of line (BEOL) network in direct contact with to the first frontside contact and the second frontside contact.

10. The semiconductor IC device of claim 9, further comprising:

a backside BEOL network in direct contact with to the first backside contact and the second backside contact.

11. The semiconductor IC device of claim 10, wherein the second frontside contact, the top source/drain, the vertical channel, the bottom source/drain, and the second backside contact are vertically inline.

12. An integrated device, comprising:

a vertical channel;

a memory microdevice connected to the vertical channel, the memory microdevice comprising a memory cell around and against each of one or more sidewalls of the vertical channel; and a logic microdevice connected to the vertical channel, the logic microdevice comprising a logic-gate insulator around and against each of the one or more sidewalls of the vertical channel, wherein a distal sidewall of the logic-gate insulator is in direct contact with to a sidewall of a logic-gate.

13. The integrated device of claim 12, wherein the memory microdevice further comprises:

a memory-gate around and against each of one or more sidewalls of the memory cell.

14. The integrated device of claim 13, further comprising:

a top source/drain in direct contact with to a top surface of the vertical channel.

15. The integrated device of claim 14, further comprising:

a bottom source/drain in direct contact with to a bottom surface of the vertical channel.

16. The integrated device of claim 15, further comprising:

a first frontside contact in direct contact with to a top surface of the memory-gate; and a second frontside contact in direct contact with to a top surface of the top source/drain.

17. The integrated device of claim 16, further comprising:

a first backside contact in direct contact with to a bottom surface of the logic-gate; and a second backside contact in direct contact with to a bottom surface of the bottom source/drain.

18. A method of semiconductor integrated circuit (IC) device fabrication comprising:

forming a vertical channel;

forming a logic-gate insulator directly against a sidewall of the vertical channel and forming a logic-gate directly against a sidewall of the logic-gate insulator, wherein a distal sidewall of the logic-gate insulator is in direct contact with to a sidewall of a logic-gate; and forming a memory cell directly against the sidewall of the vertical channel and forming a memory-gate directly against a sidewall of the memory cell.

* * * * *